United States Patent [19]
Ker

[11] Patent Number: 5,744,842
[45] Date of Patent: Apr. 28, 1998

[54] AREA-EFFICIENT VDD-TO-VSS ESD PROTECTION CIRCUIT

[75] Inventor: Ming-Dou Ker, Hsinchu, Taiwan

[73] Assignee: Industrial Technology Research Institute, Hsinchu, Taiwan

[21] Appl. No.: 698,241

[22] Filed: Aug. 15, 1996

[51] Int. Cl.$^6$ ........................................ H01L 23/62
[52] U.S. Cl. ............... 257/362; 257/355; 257/360; 257/361; 257/363
[58] Field of Search .................... 257/356, 354, 257/360, 361, 362, 355, 363

[56] References Cited

U.S. PATENT DOCUMENTS 5,255,146   10/1993   Miller .
5,440,162    8/1995   Worley et al. .
5,450,267    9/1995   Diaz et al. ...................... 361/56

OTHER PUBLICATIONS

Worley, et al., "Sub–Micron Chip ESD Protection Schemes which Avoid Avalanching Junctions," *EOS/ESD Symposium*, 95-13 –95-20 (1995).

Merrill, et al, "ESD Design Methodology," *EOS/ESD Symposium*, 93-233 –93-237, (1993).

Chatterjee, et al, "A Low–Voltage Triggering SCR for On–Chip ESD Protection at Output and Input Pads," *IEEE Electron Device Letters*, vol. 12:21–22 (Jan. 1991).

Ker, et al., "Area–Efficient CMOS Output Buffer with Enhanced High ESD Reliability for Deep Submicron CMOS ASIC," *IEEE*, 123–126 (Jan. 1995).

Ker, et al., ESD Protection for Deep–Submicron CMOS Technology Using Gate–Couple CMOS–Trigger Lateral Structure, *IEEE*, 21.2.1–21.24 (1995).

*Primary Examiner*—Valencia Martin Wallace
*Attorney, Agent, or Firm*—Fish & Richardson P.C.

[57] ABSTRACT

An electrostatic discharge (ESD) protection circuit which forms part of an integrated circuit having a VDD line and a VSS line, and which includes an ESD transient detection circuit connected between the VDD and VSS lines; and an electrostatic discharge circuit driven by the transient detection circuit and connected between the VDD and VSS lines, wherein the discharge circuit includes a bipolar transistor having an emitter and a collector, one of which is electrically connected to the VDD line and the other of which is electrically connected to the VSS line, wherein the bipolar transistor is implemented by a structure selected from a group consisting of a vertical bipolar transistor and a field oxide device, and wherein the bipolar transistor has a base that is driven by the transient detection circuit.

25 Claims, 19 Drawing Sheets

AREA-EFFICIENT VDD-TO-VSS ESD PROTECTION CIRCUIT

BACKGROUND OF THE INVENTION

The invention relates generally to electrostatic discharge (ESD) protection circuits for use in IC's.

ESD events causing damage to CMOS IC's have become a well-known reliability problem. As CMOS technology is scaled down into the submicron regime, the advanced processes which produce thinner gate oxides, shorter channel lengths, shallower source/drain junctions, LDD (Lightly-Doped Drain) structures, and silicided diffusions, have further degraded ESD robustness of submicron CMOS IC's (see, C. Duvvury and A. Amerasekera, "ESD: A pervasive reliability concern for IC technologies," in *Proc. of IEEE*, vol.81, no.5. pp.690–702, May 1993; and A. Amerasekera and C. Duvvury, "The impact of technology scaling on ESD robustness and protection circuit design," 1994 *EOS/ESD Symp. Proc., EOS-16*, pp. 237–245). For submicron CMOS IC's, the design of efficient and reliable ESD-protection has become even more challenging. Traditionally, to provide ESD protection people have added an ESD protection circuit at the input pad of the circuit to protect the gate oxide of the input stage and have made efforts to improve the output buffer at the output pad to improve the ESD robustness of output buffer. Many patents have issued regarding various input or output ESD protection designs.

In addition to adding ESD protection circuits at the input and the output of the CMOS IC circuits, there is a further important concern regarding unexpected ESD damage to internal circuits that are beyond the protective effect of the input or output ESD protection circuits. Since ESD stress on an input (or output) pin may be either a positive or negative voltage with respect to grounded VDD or VSS pins, there are four different possible ESD-stress conditions which can occur. These are shown in FIGS. 1a–d and they are:

PS mode:
  ESD stress at a pin with positive voltage polarity with respect to the VSS pin when the VDD pin and the other input/output pins are floating (FIG. 1a);

NS mode:
  ESD stress at a pin with negative voltage polarity with respect to the VSS pin when the VDD pin and the other input/output pins are floating (FIG. 1b);

PD mode:
  ESD stress at a pin with positive voltage polarity with respect to the VDD pin when the VSS pin and the other input/output pins are floating (FIG. 1c); and ND mode:
  ESD stress at a pin with negative voltage polarity with respect to the VDD pin when the VSS pin and the other input/output pins are floating (FIG. 1d).

These ESD stresses can cause damage on both input/output devices and internal circuits of CMOS IC's.

In traditional ESD designs, ESD protection is typically provided from the pad to VSS (or ground). There is no additional ESD protection element provided between the pad and VDD. Without any effective ESD-protection element provided between the pad and VDD, unexpected ESD damage has been found to occur in internal circuits that are beyond the protective reach of the ESD protection circuits. FIG. 2 shows a schematic diagram which helps explain the unexpected discharging paths from an input pad to internal circuits of CMOS IC under ND-mode ESD-stress conditions. The ND-mode ESD-stress voltage 2 between the input pad 4 and VDD 6 is first diverted to the floating VSS power line 8 through an input ESD protection circuit 10 which is connected between the input pad and VSS. The diverted negative ESD voltage on the VSS power line will cause voltage stress on internal circuits 12 between the VSS and VDD power lines. If this voltage stress between the VSS and VDD power lines cannot be effectively and quickly bypassed through VDD-to-VSS ESD protection circuit, the ND-mode ESD current may flow into the internal circuits where it will cause unexpected ESD damage. Because most devices and the layout of the internal circuits are often designed in accordance with minimum spacing design rules to save chip size, such internal circuits are particularly vulnerable to ESD stress. Due to parasitic resistance (Rdd and Rss) and capacitance (C) along the VDD and VSS power lines, as well as the voltage drop on the VDD-to-VSS ESD protection element, such ND-mode ESD stress can easily cause unexpected ESD damage on the internal circuits.

ESD stress on the output buffer can also lead to unexpected ESD damage to the internal circuits that are beyond the output buffer or the protective reach of the ESD protection circuits. FIG. 3 shows a schematic diagram to explain the unexpected discharging paths from the output pad through the internal circuits of a CMOS IC under ND-mode ESD-stress conditions. Before the output PMOS device 20 breaks down to bypass ESD current from the output pad 22 to VDD, the ND-mode ESD-stress voltage between the output pad and VDD is first diverted to the floating VSS power line 24 through the output NMOS 26 which is connected between the output pad and VSS. The diverted negative ESD voltage on the VSS power line causes voltage stress between the VSS and VDD power lines. If this voltage stress between the VSS and VDD power lines cannot be effectively and quickly bypassed through the VDD-to-VSS ESD protection circuit, the ND-mode ESD voltage will further cause unexpected ESD damage on internal circuits 28. Due to the parasitic resistance ($R_{DD}$ and $R_{SS}$) and capacitance ($C_{DD}$) of the VSS and VDD power lines in the CMOS IC, as well as the voltage drop on the VDD-to VSS ESD protection elements, such ND-mode ESD stress has also been reported to cause some unexpected ESD damage on internal circuits beyond the output buffer and ESD protection circuits.

Moreover, ESD stress may, as a practical matter, occur between any two pins of a CMOS IC. If a positive ESD voltage occurs on the VDD pin with a grounded VSS pin, ESD stress is directly imposed on the internal circuits. If there is no effective VDD-to-VSS ESD protection circuit between VDD and VSS power lines, this will cause serious ESD damage to those internal circuits.

From the above discussion it should be clear that ESD stress, even on input or output pins, may still cause ESD damage on the internal circuits beyond the protective reach of the input/output ESD protection circuits. Thus, to provide effective ESD protection for CMOS IC's and avoid ESD damage, an efficient ESD protection circuit located between the VDD and VSS power lines is needed.

One typical ESD protection design for CMOS IC's is shown in FIG. 4. A double-diode structure (i.e., Dp1 and Dn1) is used as the input ESD protection circuit, and a CMOS output buffer 30 with large-dimensions also functions as an ESD protection device to protect the output buffer. A gate-ground NMOS (GGNMOS) 32 of large device dimensions is added between the VDD and VSS power lines as the VDD-to-VSS ESD protection device. If there is an ESD voltage across the VDD and VSS power lines, this GGNMOS will break down to bypass ESD current. If there is negative ESD voltage on VDD but VSS is grounded, the parasitic diode, which exists everywhere in the well/substrate junction of CMOS IC's, will forward bias and thus turn on to bypass the ESD current.

In FIG. 4, the PS-mode or ND-mode ESD stress on the input or output pins will lead to an ESD voltage across the VDD and VSS power lines which run through the chip. As PS-mode ESD stress occurs on the input or output pad, the ESD voltage can be diverted to the floating VDD power line through the diode Dp1 (or Dp2) to bypass ESD current before diode Dn1 or NMOS in the output buffer breaks down. The ESD stress will occur not only on diode Dn1 or NMOS in the output buffer but also on the internal circuits across the VDD and VSS power lines. The ND-mode ESD stress on the input or output pads will also lead to similar results, imposing ESD stress on the internal circuits between the VDD and VSS power lines.

Of course, if ESD stress occurs directly from the VDD to VSS pins, the internal circuits are more vulnerable to ESD damage. Even though there is a GGNMOS made as an ESD-protection device across the VDD and VSS power lines, the internal circuits are still vulnerable to ESD damage. Because the NMOS device performs ESD protection for the CMOS IC's, it also has to protect itself. So, the channel length of GGNMOS and the layout spacing from drain contact to polygate edge are usually designed without using minimum spacing design rules so as to provide sufficient ESD robustness for self-protection. However, since the internal circuits are generally designed according to minimum spacing design rules, this leads to a problem since the device with minimum layout spacing will break down before the GGNMOS with its larger layout spacing breaks down to bypass ESD current. The devices in the internal circuits fabricated using submicron or deep-submicron CMOS technologies are particularly vulnerable to ESD stress. Thus, unexpected ESD damage to the internal circuits beyond the GGNMOS device still occurs. In other words, a GGNMOS device is not enough to effectively protect the internal circuits of CMOS IC's. A more efficient VDD-to-VSS ESD protection circuit with lower turn-on or breakdown voltage is much needed for the submicron and deep-submicron CMOS IC's.

To improve the ESD-protection efficiency of the NMOS between the VDD and VSS power lines, an additional ESD-transient detection circuit 40 has been added to the gate of protection NMOS, as shown in FIG. 5. This ESD-transient detection circuit turns on the protection NMOS to bypass ESD current when there is ESD stress across the VDD and VSS power lines. Instead of the GGNMOS breaking down, the ESD-protection NMOS in FIG. 5 turns on to limit the ESD voltage across the VDD and VSS power lines. The internal circuits are thus effectively protected by this design, because the turning-on NMOS can provide a nearly short circuit between the VDD and VSS power lines to clamp the ESD voltage across the power lines. Two typical previous circuits using this approach are shown in FIG. 6 and FIG. 7.

In FIG. 6, a control circuit based on an RC time constant is designed to turn on a short-channel thin-oxide NMOS device, whose drain and source are connected to the VDD and VSS power lines, respectively. To effectively bypass ESD current through the turned-on NMOS without causing damage to it, the short-channel thin-oxide NMOS was designed with a device dimension (W/L) as large as 8000/0.8 (µm) (see, R. Merrill and E. Issaq, "ESD design methodology," 1993 EOS/ESD symposium proceedings, EOS-15, pp. 233–237. 11). The inverters used to drive such a large-dimension NMOS also have large device dimensions. The design can effectively protect the internal circuits from ESD damage, but the layout area has to be substantially increased to implement a VDD-to-VSS ESD protection circuit which require such large dimension devices.

In FIG. 7, a more complex ESD-transient detection circuit is presented which detects ESD stress and turns on the ESD-protection NMOS. For the reasons described above, the ESD-protection NMOS must have very large device dimensions (e.g. 6300/1.1 (µm)) to perform effective ESD protection for the CMOS IC and for the NMOS itself. (See, U.S. Pat. 5,255,146, by W. Miller, entitled "Electrostatic Discharge Detection and Clamp Control Circuits,", issued 1993.)

Other similar ESD protection designs using VDD-to-VSS ESD protection can be found in the following references:

U.S. Pat. 5,311,391, by T. Dungan and E. Coussens, entitled "Electrostatic Discharge Protection Circuit with Dynamic Triggering," 1994;

S. Dabral, R. Aslett, and T. Maloney, "Core clamps for low voltage technologies," 1994 *EOS/ESD Symposium Proceedings*, EOS-16, pp. 141–149;

E. R. Worley, R. Gupta, et. al., "Sub-micron chip ESD protection schemes which avoid avalanching junctions," 1995 *EOS/ESD Symposium Proceedings*, EOS-17, pp. 13–20;

G. D. Croft, "ESD protection using a variable voltage supply clamp," 1994 *EOS/ESD Symposium Proceedings*, EOS-16, pp. 135–140;

J. T. Watt and A. J. Walker, "A hot-carrier triggered SCR for smart power bus ESD protection," 1995 *IEDM Technical Digest*, pp. 341–344; and T. Maloney and S. Dabral, "Novel clamp circuits for IC power supply protection," 1995 *EOS/ESD Symposium Proceedings*, EOS-17, pp. 1–12.

Because the ESD transient current can be several amperes during a very short time duration (about 100–200 ns), the ESD-protection NMOS in FIG. 6 and FIG. 7 has to be designed with a large device dimension to bypass this ESD current. But, such large device dimensions requires more layout area for the chip. Moreover, the advanced process technologies have been reported to significantly reduce ESD robustness of short-channel thin-oxide NMOS devices with an LDD and a silicided diffusion. The NMOS device with an LDD and a silicided diffusion easily leads to ESD damage around the LDD peak 50 in the drain region, as shown in FIG. 8. This structure also requires large device dimensions for the ESD-protection NMOS to bypass ESD current. However, too large a device dimension for the ESD-protection NMOS will make it impractical for IC products. So, an area-efficient VDD-to-VSS ESD protection circuit is still much needed by IC designers to perform effective whole-chip ESD protection without increasing the cost of IC product.

SUMMARY OF THE INVENTION

The invention is an area-efficient VDD-to-VSS ESD protection circuit which provides whole-chip ESD protection without using large device dimensions. The area-efficient ESD protection circuit protects internal circuits of CMOS IC's against ESD damage. There are two basic components in this circuit. One component is an ESD-transient detection circuit, and the other component is an ESD-discharging device. When the IC is under ESD-stress conditions, the ESD-transient detection circuit generates a trigger voltage which turns on the ESD-discharging device. However, the ESD-transient detection circuit does not trigger on the ESD-discharging device under normal CMOS operating conditions or during the power-on transition of CMOS IC's. When the ESD-discharging device is turned on, it bypasses ESD current through parasitic bipolar action in a field-oxide device. Partly due to the lack of an LDD structure in the field-oxide, ESD robustness of field-oxide device is much higher than that of a thin-oxide device. Thus, the layout area required for this ESD protection circuit can be reduced without compromising the ESD protection robustness for CMOS IC's between VDD and VSS power lines. By using this area-efficient ESD protection circuit, the total layout area for VDD-to-VSS ESD protection can be efficiently reduced to save silicon for the IC product.

In general, in one aspect, the invention is an electrostatic discharge (ESD) protection circuit which forms part of an integrated circuit having a VDD line and a VSS line. The protection circuit includes an ESD transient detection circuit connected between the VDD and VSS lines; and an electrostatic discharge circuit driven by the transient detection circuit and connected between said VDD and VSS lines. The discharge circuit includes a bipolar transistor having an emitter and a collector, one of which is electrically connected to the VDD line and the other of which is electrically connected to the VSS line and the bipolar transistor is implemented by a structure selected from a group consisting of a vertical bipolar transistor and a field oxide device. The bipolar transistor has a base that is driven by the transient detection circuit.

Preferred embodiments have the following features. The emitter region and the collector regions are connected directly to their respective VDD and VSS lines. When the electrostatic protection circuit of claim 1 wherein the bipolar transistor is implemented by the field oxide device, the channel region of that device is sufficiently narrow to enable the field oxide device to operate as the bipolar transistor. The electrostatic discharge circuit also includes a well region extending below the source region.

Also, in preferred embodiments, the field-oxide device is an n-type field oxide device. In some cases, the electrostatic discharge circuit is formed in a p-type substrate and the field oxide device includes a p-type region extending into the p-type substrate; a first n-type region extending into the p-type substrate and positioned so that it surrounds and is spatially separated from the p-type region; a second n-type region extending into the p-type substrate and positioned so that it surrounds and is spatially separated from the first n-type region; and an oxide layer bridging between the first and second n-type regions. The field oxide device further includes a third n-type region passing through and extending below the second n-type region to form an n-type well structure. Also, the third n-type region surrounds the first n-type diffusion. In addition, the field oxide device also includes a second p-type region extending into the p-type substrate and positioned so that it surrounds the second n-type region. Further, the first and second n-type regions are doped to n+ doping levels and the first mentioned p-type region is doped to a p+ doping level.

Also in preferred embodiments, the electrostatic discharge circuit is formed in a n-type substrate and the field oxide device includes a p-well region formed in the n-type substrate; a p-type region extending into the p-well region; a first n-type region extending into the p-well region and positioned so that it surrounds and is spatially separated from the p-type region; a second n-type region extending into the p-well region and positioned so that it surrounds and is spatially separated from the first n-type region; and an oxide layer bridging between the first and second n-type regions. The first and second n-type regions are doped to n+ doping levels and the first mentioned p-type region is doped to a p+ doping level.

In still other preferred embodiments, the bipolar transistor is implemented by the vertical bipolar transistor, e.g. either a p-n-p device or an n-p-n device. In the case when the vertical bipolar transistor is a p-n-p device and the electrostatic discharge circuit is formed in a p-type substrate, then the vertical bipolar transistor includes an n-well region extending into the p-type substrate; an n-type region extending into the n-well region; a first p-type region extending into the n-well region and positioned so that it surrounds and is spatially separated from the n-type region; and a second p-type region extending into the p-type substrate and positioned so that it surrounds and is spatially separated from the n-well region. In that implementation, the first and second p-type regions are doped to p+ doping levels and the n-type region is doped to an n+ doping level.

In the case when the vertical bipolar transistor is an n-p-n device and the electrostatic discharge circuit is formed in a n-type substrate, then the vertical bipolar transistor includes a p-well region extending into the n-type substrate; a p-type region extending into the p-well region; a first n-type region extending into the p-well region and positioned so that it surrounds and is spatially separated from the p-type region; and a second n-type region extending into the n-type substrate and positioned so that it surrounds and is spatially separated from the p-well region. In that case, the first and second n-type regions are doped to n+ doping levels and the p-type region is doped to a p+ doping level.

Also in preferred embodiments, the ESD transient detection circuit includes a resistor in series with a capacitor and an inverter coupled to the resistor and capacitor. The capacitor is implemented by a NMOS device and the inverter is formed by a PMOS device and an NMOS device connected in series. The output of the inverter drives the base of the bipolar transistor.

Other advantages and features will become apparent from the following description of the preferred embodiment and from the claims.

DESCRIPTION OF THE PREFERRED EMBODIMENTS Circuit Configuration

Figure 1A:
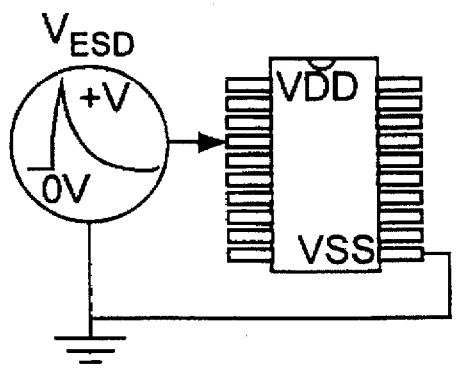
FIG. 1(a–d) illustrate four modes of ESD stress on an input (or output) pin of a CMOS IC.
Figure 1B:
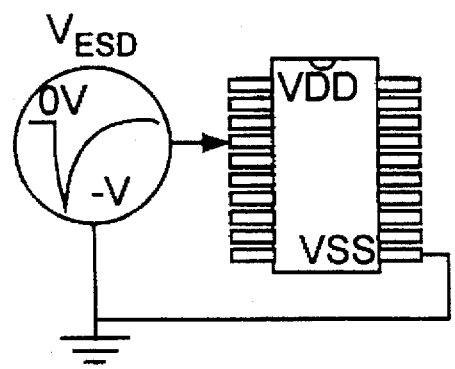
Figure 1C:
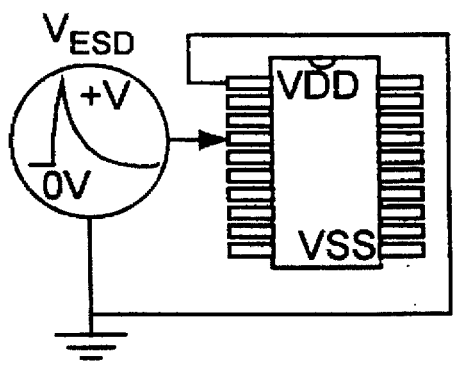
Figure 1D:
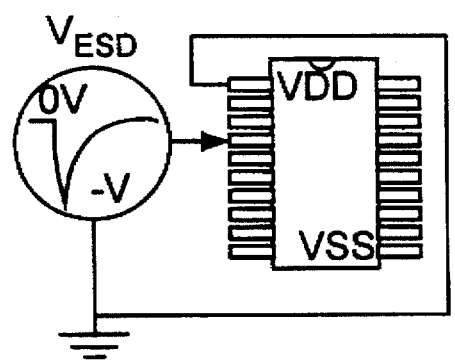
Figure 2:
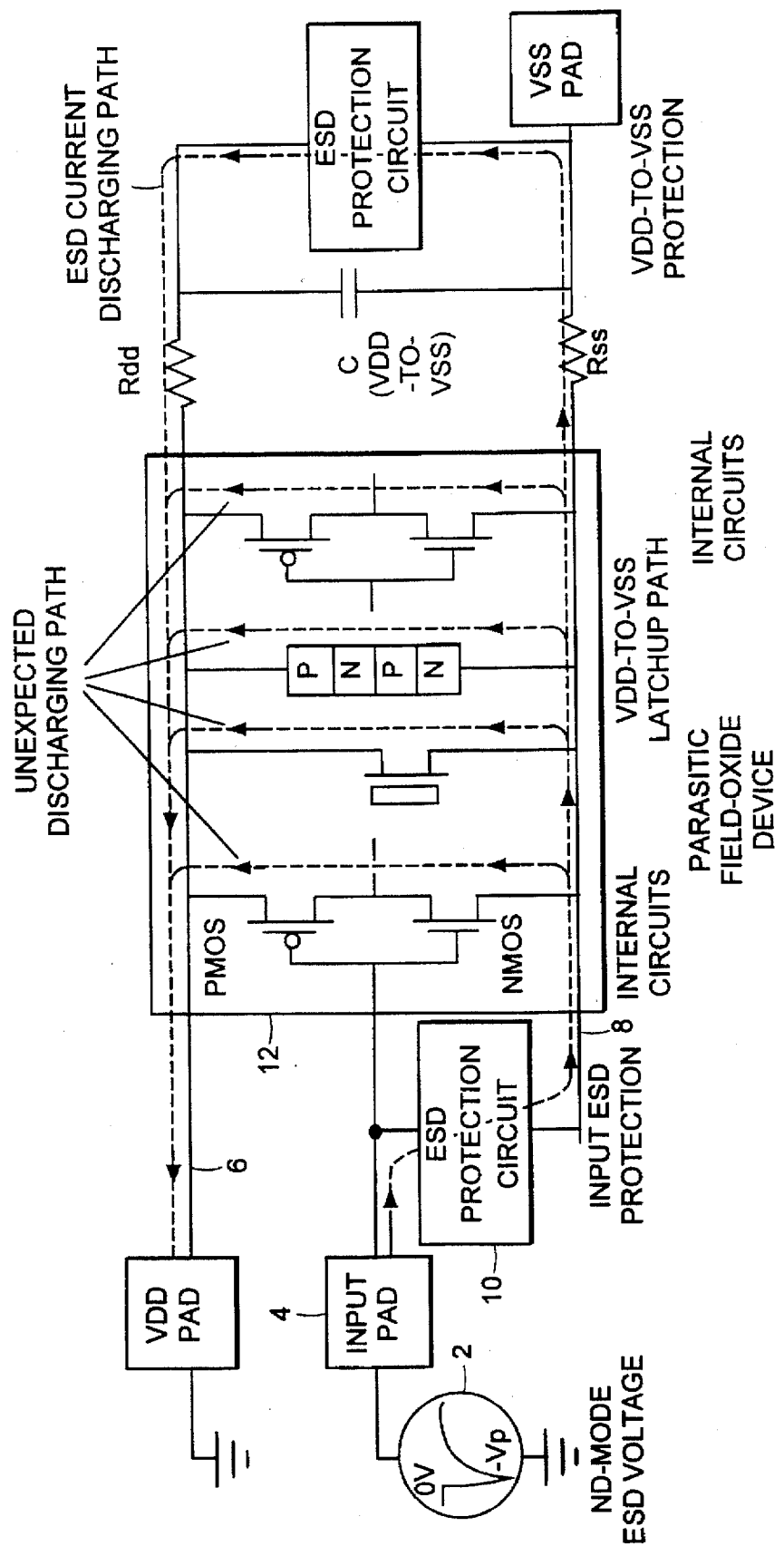
FIG. 2 illustrates discharge paths from an input pad through internal circuits of a CMOS IC under an ND-mode ESD stress condition.
Figure 3:
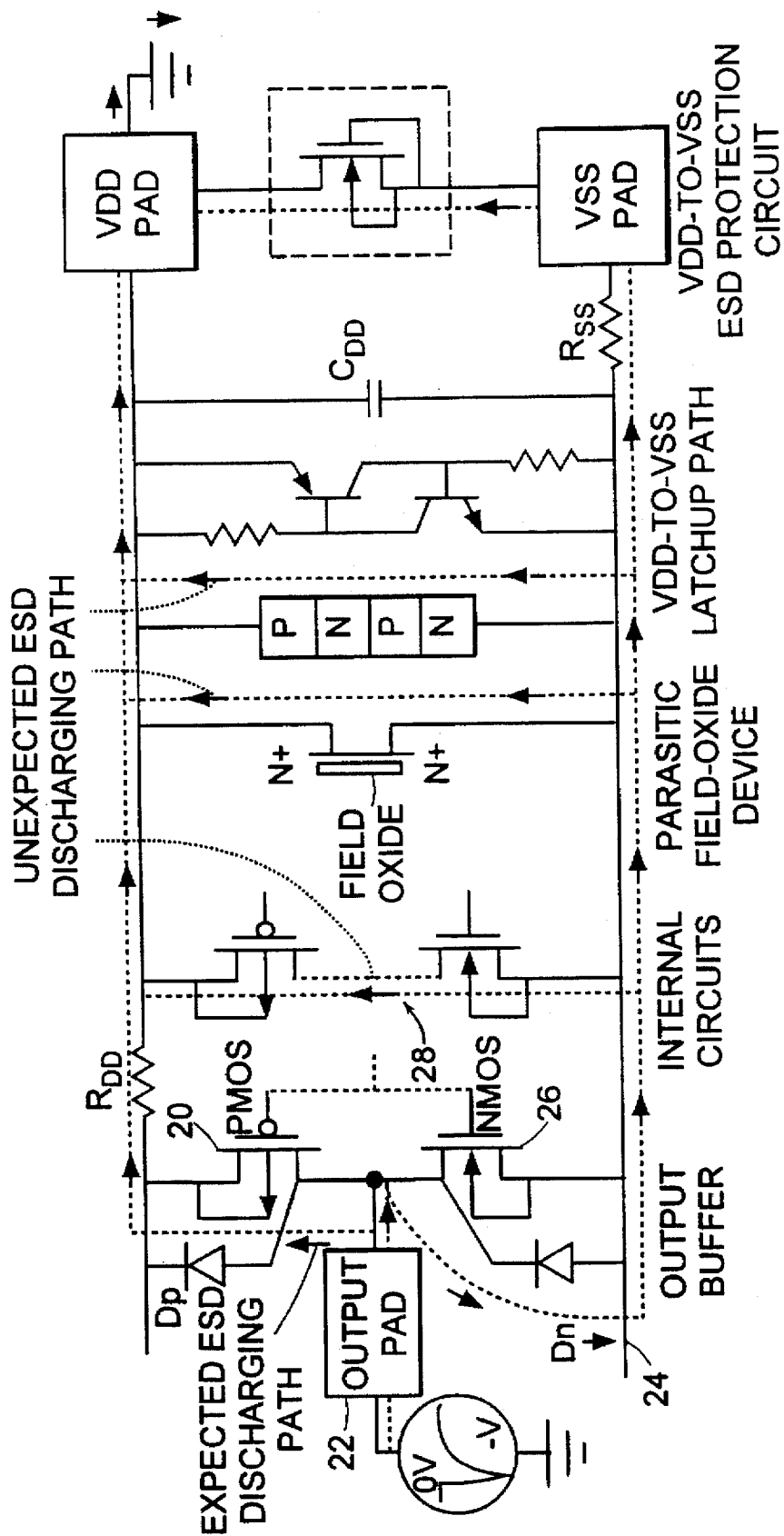
FIG. 3 illustrates discharge paths from an output pad through internal circuits of a CMOS IC under an ND-mode ESD stress condition.
Figure 4:
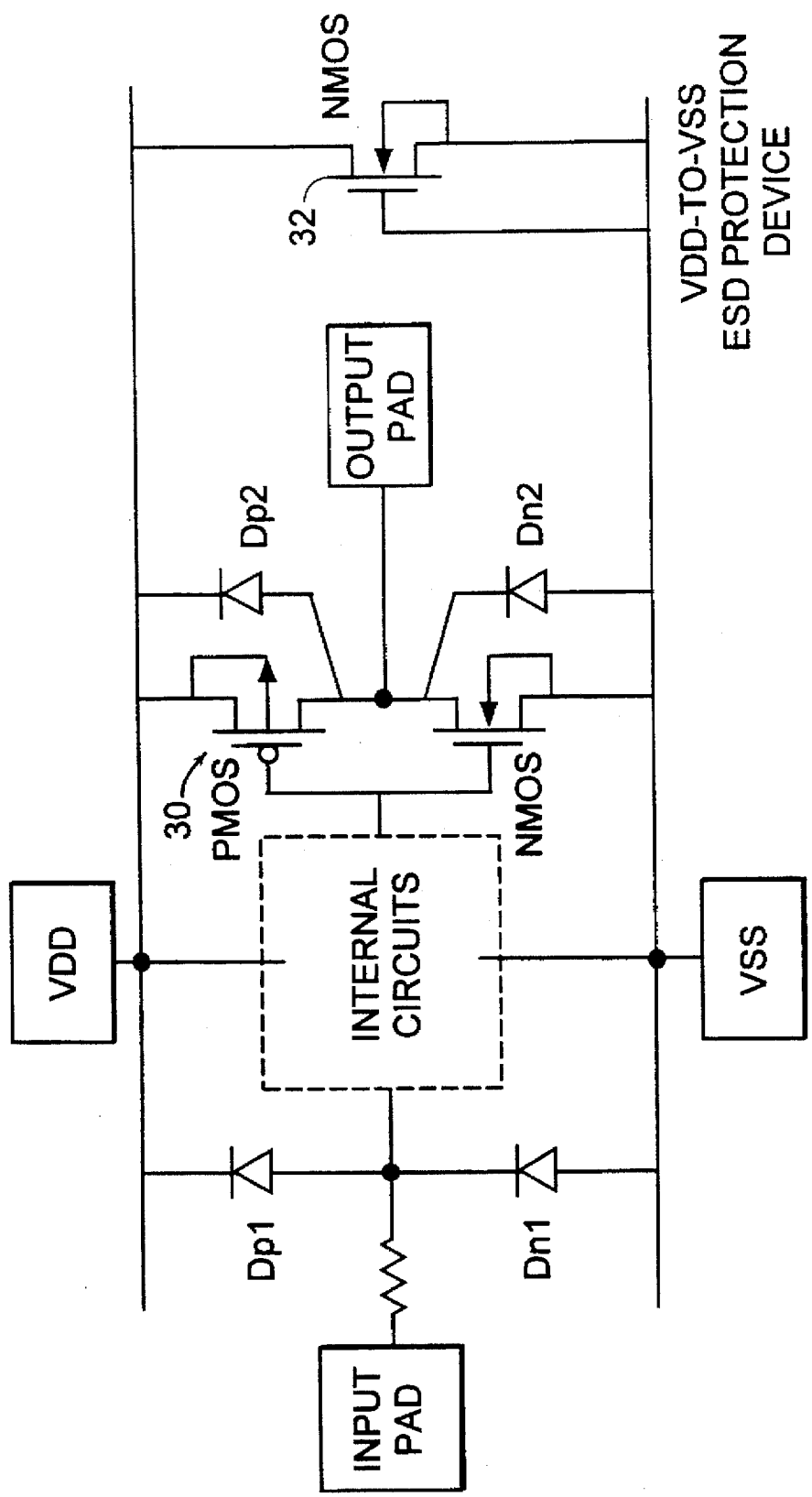
FIG. 4 shows a typical prior art ESD protection circuit design for a CMOS IC.
Figure 5:
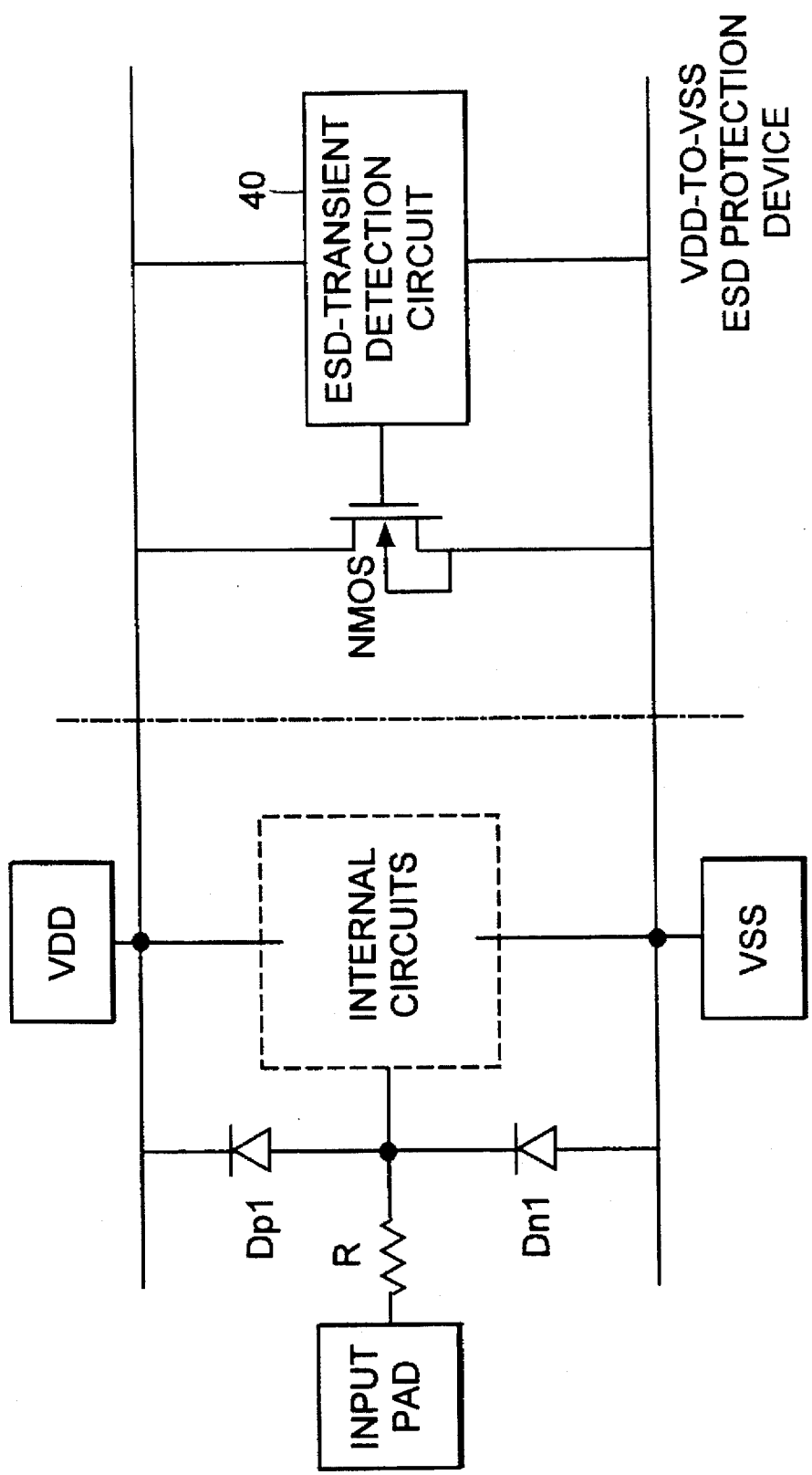
FIG. 5 shows a prior art ESD-transient protection circuit added to the gate of an NMOS protection element.
Figure 6:
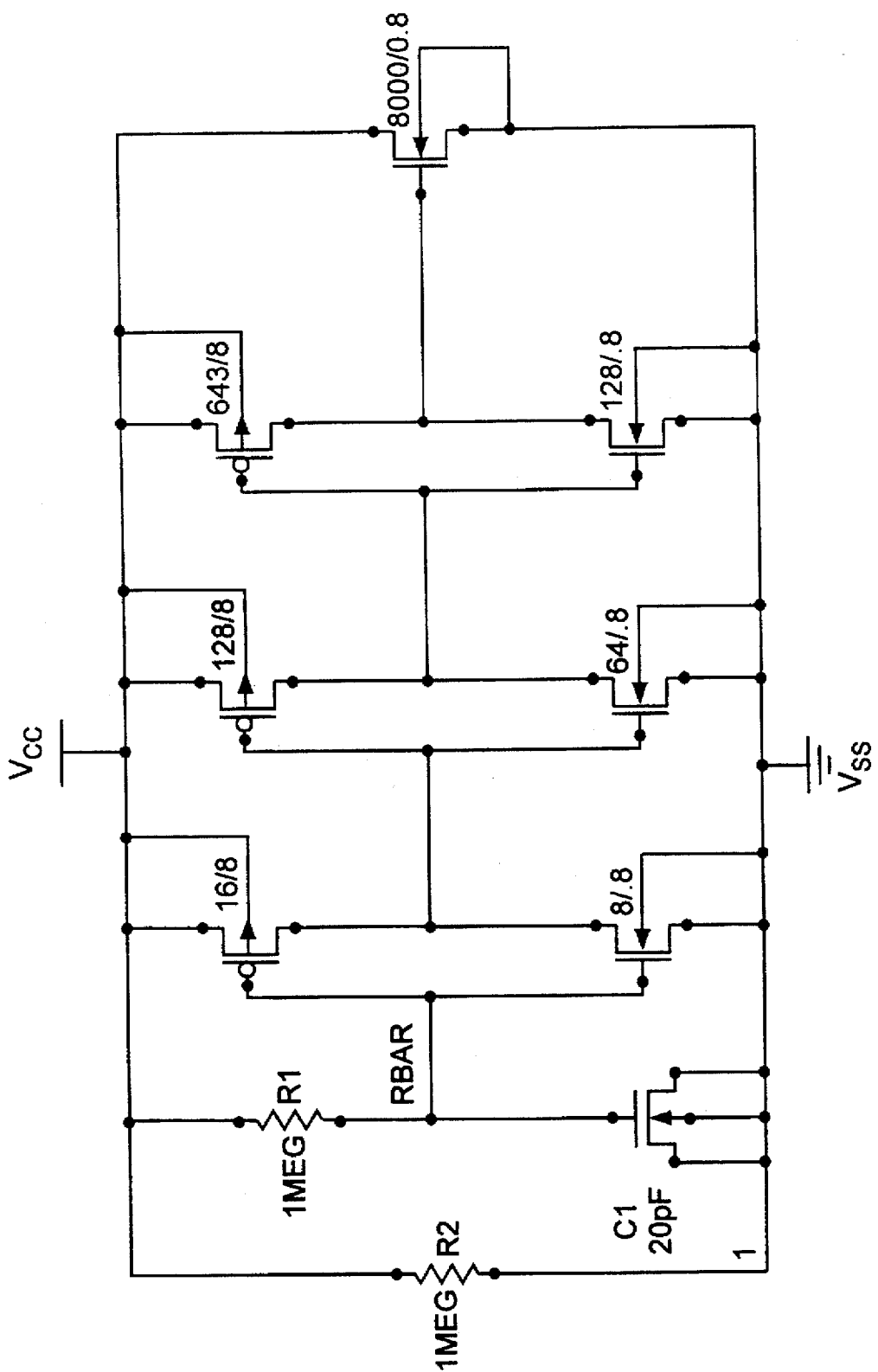
FIG. 6 shows a prior art control circuit (i.e., transient detection circuit) which uses an RC time constant.
Figure 7:
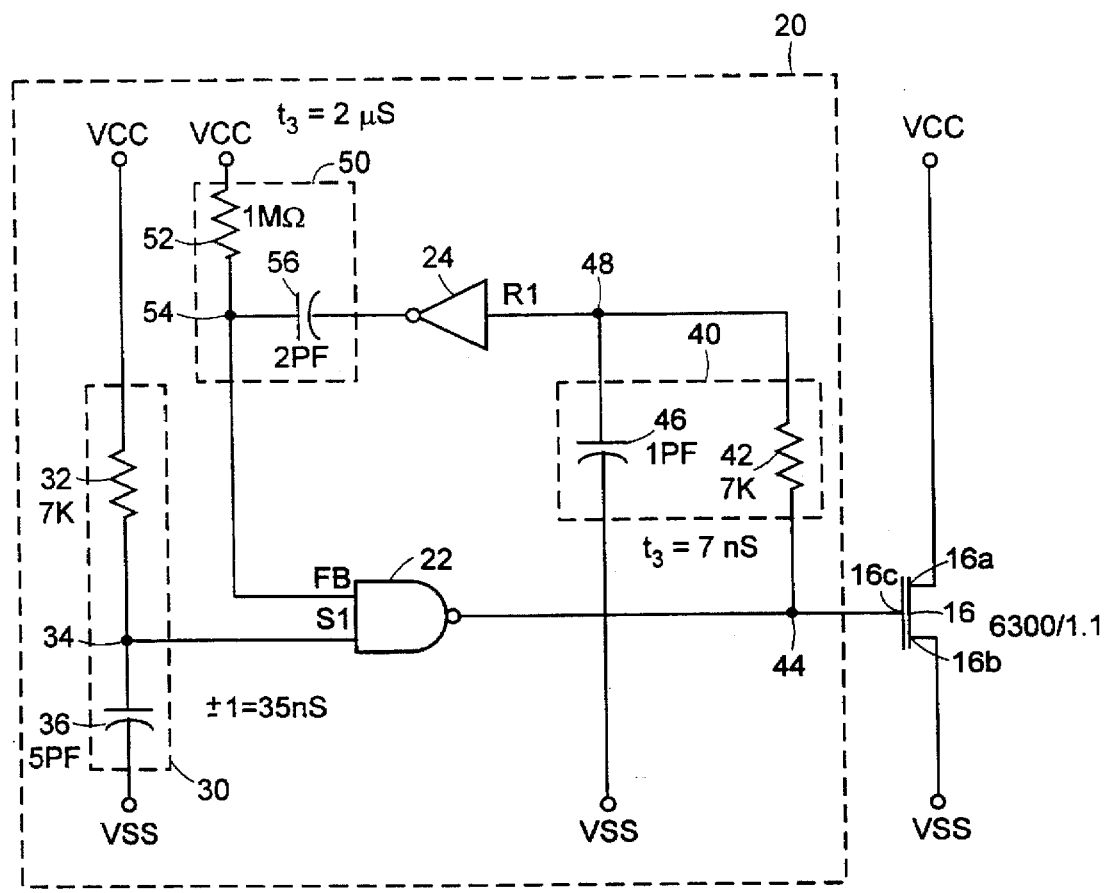
FIG. 7 shows a more complex ESD protection circuit of the prior art.
Figure 8:
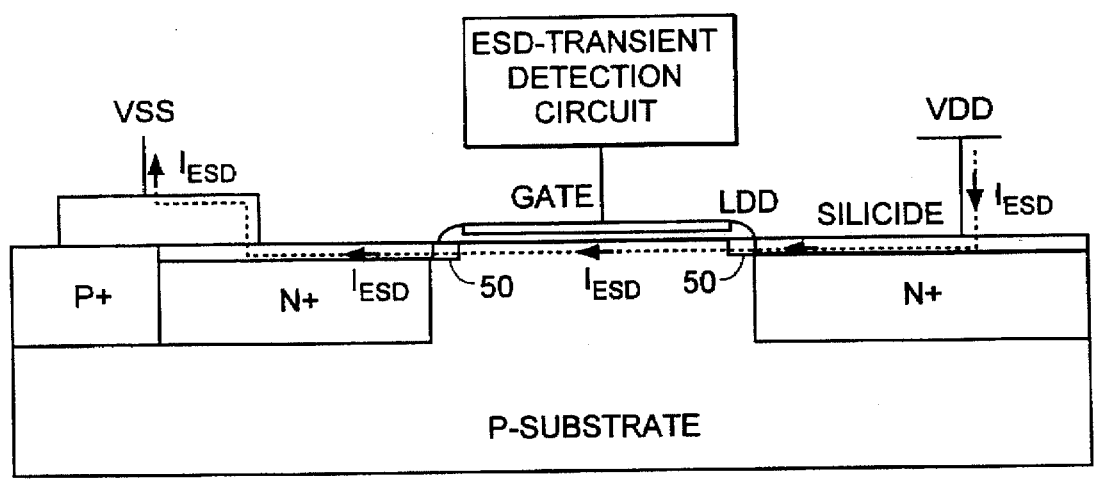
FIG. 8 shows a characteristic discharge path for an NMOS device with an LDD in the drain regions.
Figure 9:
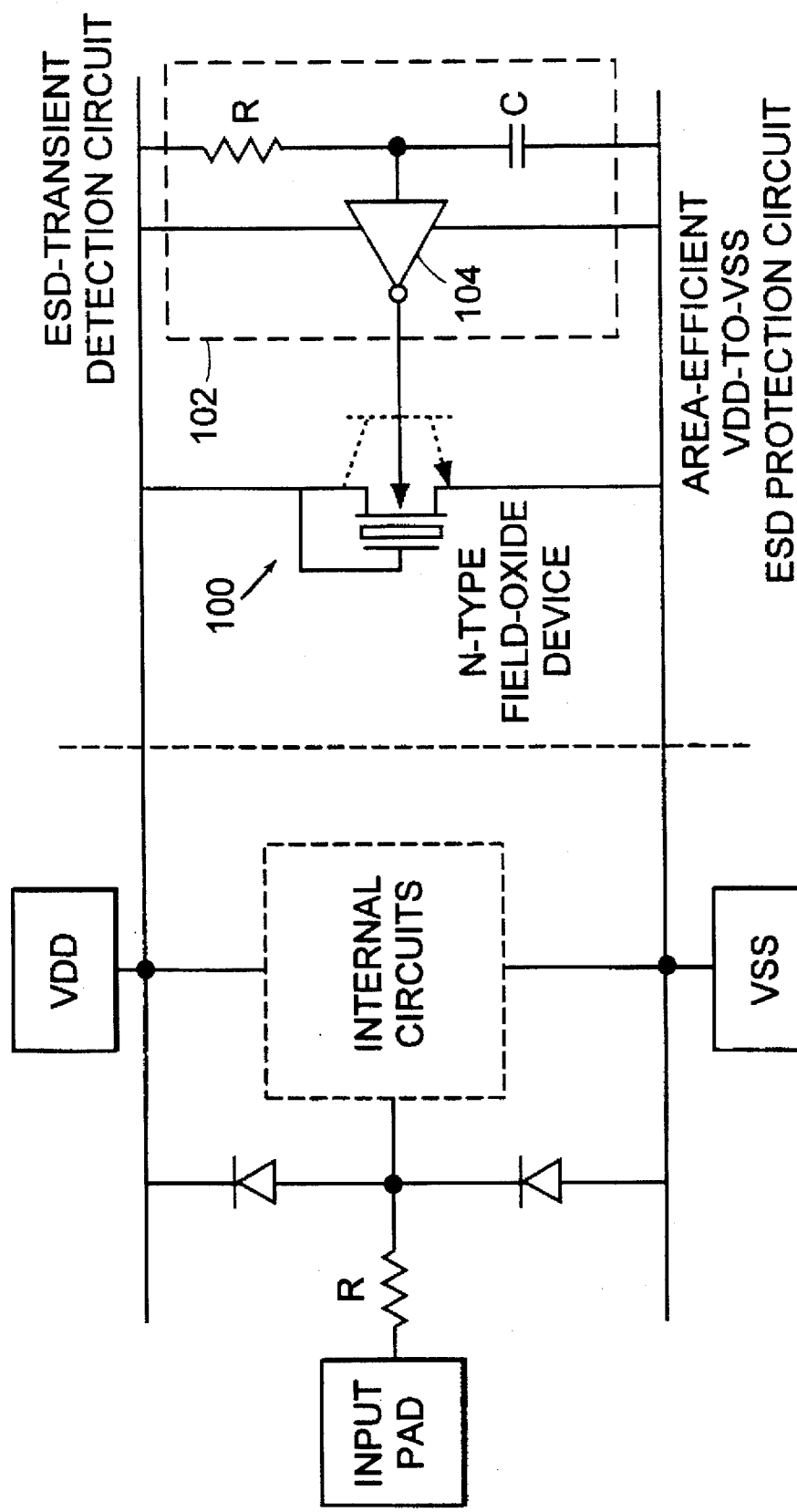
FIG. 9 shows an area-efficient VDD-to-VSS ESD protection circuit according to the invention.

The proposed area-efficient VDD-to-VSS ESD protection circuit is shown in FIG. 9, where an N-type field-oxide device 100 replaces the thin-oxide NMOS as the ESD-discharging device to bypass ESD current. The ESD-transient detection circuit 102 is formed by a resistor R, a capacitor C, and an inverter 104. This ESD-transient detection circuit is designed to detect an ESD pulse across the VDD and VSS power lines, and to turn on the N-type field-oxide device 100 to bypass ESD current. Under normal operating conditions of CMOS IC's, this ESD-transient detection circuit keeps the N-type field-oxide device off. Although the gate of the N-type field-oxide device is connected to the VDD node, this N-type field-oxide device still cannot be turned on under normal operating conditions of the CMOS IC with a VDD of 5V, because the turn-on threshold voltage of such N-type field-oxide devices according to general CMOS processes is as high as 15~20V.

Figure 10A:
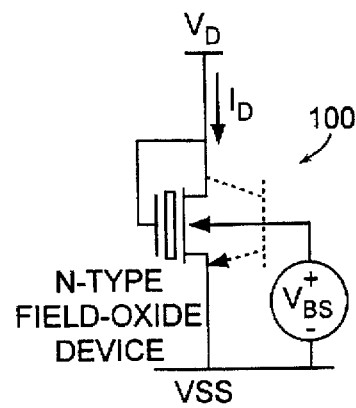
FIG. 10(a) shows an N-type field oxide device.
Figure 10B:
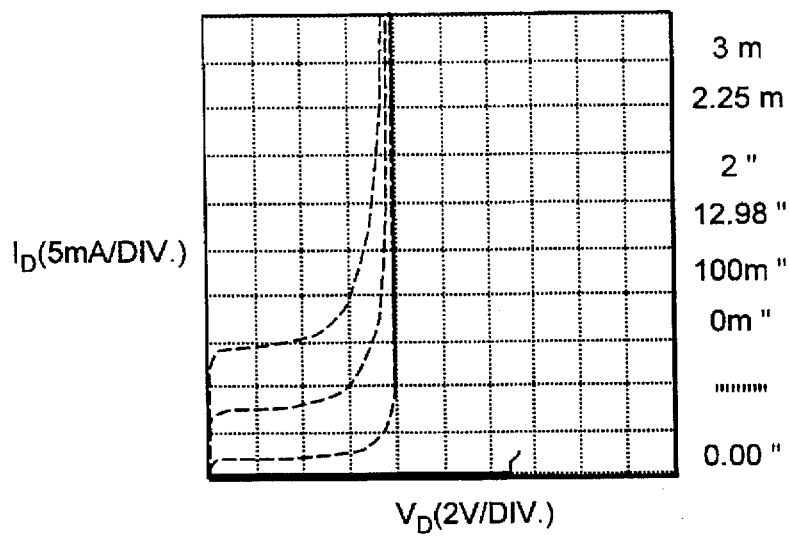
FIG. 10(b) shows the IV characteristic of the parasitic bipolar within the N-type field oxide device.
Figure 10C:
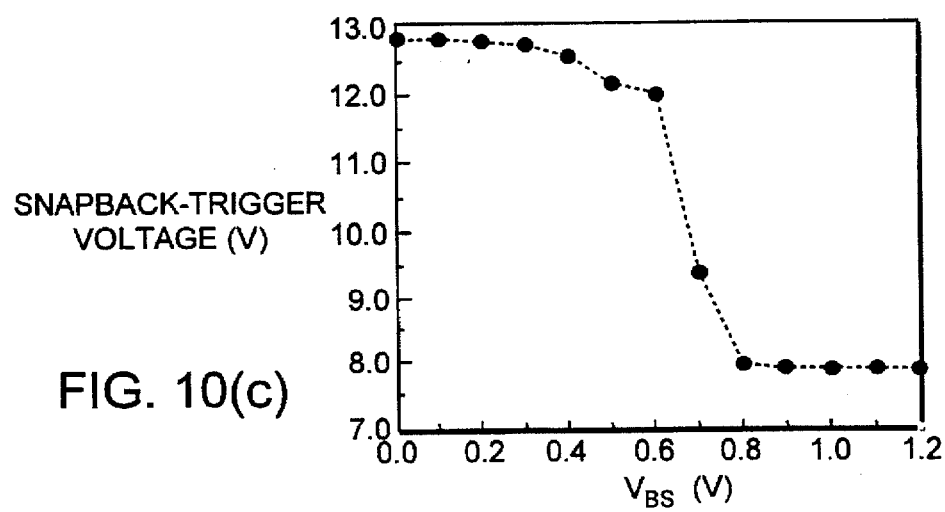
FIG. 10(c) shows the snapback trigger voltage for the device of FIG. 10(a) as a function of VBS.

The N-type field-oxide device is designed to work as a bipolar junction transistor (BJT) to bypass the ESD current. This is accomplished by keeping the channel length sufficiently short to permit bipolar operation of the field-oxide device. If a positive voltage is applied to the bulk of the N-type field-oxide device (i.e., the base of the parasitic n-p-n BJT) as shown in FIG. 10(a), its I-V characteristics of lateral bipolar action in an N-type field-oxide device is shown in FIG. 10(b). As $V_D$ is increased, the N-type field-oxide device will enter into its snapback region. The N-type field-oxide device can be safely operated in its snapback region to bypass ESD current, as long as the ESD current does not cause thermal breakdown (also referred to as secondary breakdown) in the N-type field-oxide device. The occurrence of thermal breakdown on the N-type field-oxide device is the ESD-protection limitation of the N-type field-oxide device. Because there is no LDD peak structure in the N-type field-oxide device and because the ESD current is conducted through a bulk region of large volume, the N-type field-oxide device has been found to be more robust than the thin-oxide NMOS device. In contrast, the ESD current in the thin-oxide NMOS device is conducted through the channel of the NMOS, which in a short-channel thin-oxide NMOS device with a 5-V gate bias is only about 100~300 Å deep. Such a shallow channel depth for current conduction coupled with the LDD peak in the drain of NMOS device leads to much less robust ESD protection than that which is achievable in the N-type field-oxide device. By using this physical advantage of the N-type field-oxide device, an effective VDD-to-VSS ESD protection circuit can be designed without using an ESD-discharging device of large dimensions.

Operating Principles

Figure 11:
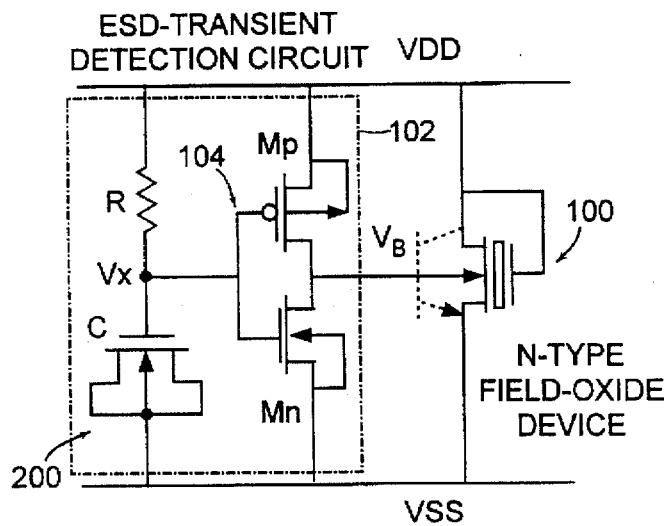
FIG. 11 shows an area-efficient VDD-to-VSS protection circuit with a particular implementation of an ESD-transient detection circuit.

The design and operation principles are explained with the aid of FIG. 11, which shows a practical implementation of the area-efficient VDD-to-VSS ESD protection circuit. The inverter 104 in the ESD-transient detection circuit 102 is implemented by PMOS Mp and NMOS Mn connected in series. In addition, when using a general CMOS process, the capacitor C in FIG. 9 can be realized by an NMOS device 200.

ESD-stress condition

Under this condition, the N-type field-oxide device will turn on to bypass ESD current. Before the ESD stress is applied across the VDD and VSS power lines, the node voltage $V_x$ is initially zero. The RC time constant in the circuit, as determined by R and the capacitance of the NMOS, is designed to be about 0.1~1.0 μs. As ESD voltage occurs on the VDD power line with VSS grounded, the voltage on the VDD node rises up quickly, and the capacitor is charged through resistor R. The rise time of ESD voltage is about 5~15 ns, much faster that the RC time constant, so $V_x$ increases very slowly as compared to VDD. Thus, the low $V_x$ voltage on the input of the inverter, which is formed by PMOS Mp and NMOS Mn, turns on Mp so as to sustain a high voltage $V_b$ at its output node. With $V_b$ being a high voltage, the bipolar action in the N-type field-oxide device will turn on to bypass the ESD current. Due to the fact that the ESD current is conducted through the bulk of the N-type field-oxide device, it can sustain much higher ESD stress than the thin-oxide NMOS. So, the size of the N-type field-oxide device required to provide sufficient ESD robustness can be much smaller than that of the thin oxide NMOS of the prior art. Thus, the layout area required to implement this ESD protection circuit can be significantly smaller.

Figure 12A:
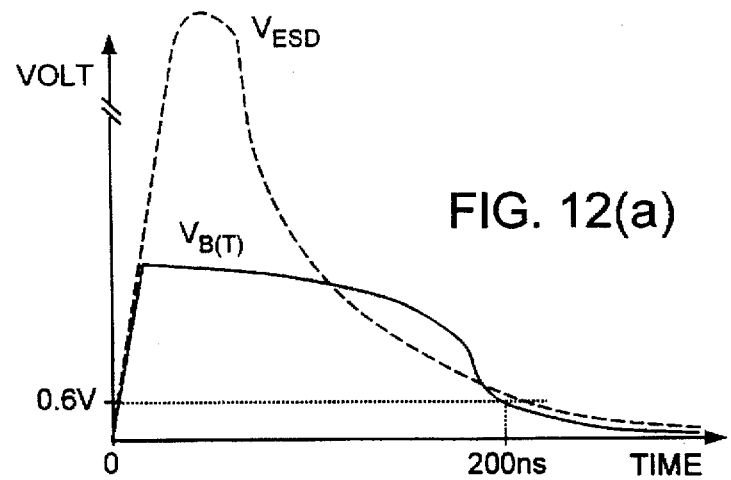
FIG. 12(a) shows a plot Of $V_{ESD}$ and $V_B(t)$.

To explain the operating principles in time domain, we refer to the voltage waveform shown in FIG. 12(a). $V_{ESD}$ is the ESD voltage on the VDD power line. With such ESD voltage on the VDD node, the ESD-transient detection circuit generates a $V_B$ voltage as shown in FIG. 12(a). Due to the transition of ESD event, which is about 100~200 ns, the N-type field-oxide device should be turned on a longer period of time so as to bypass the ESD current. Because the cut-in voltage (i.e. the turn-on voltage) of BJT is about 0.6V, $V_B$ should be designed to provide a voltage higher than 0.6V for as long as 200 ns to bypass the ESD current. This can be achieved by adjusting the dimensions of the R, C, Mp, and Mn devices.

VDD power-on condition

During normal CMOS operation, VDD is at a fixed voltage, e.g. 5V. However, during power on, VDD rises up to this level from 0V. This causes the so-called VDD voltage power-on transition. Under this power-on condition, the N-type field-oxide device must remain off. If the N-type field-oxide device is turned on during power-on, the 5-V VDD power is lost through the N-type field-oxide device. To keep the N-type field-oxide device off during the power-on condition, the RC time constant in the ESD-transient detection circuit needs to be much smaller than the rise time of power-on VDD voltage. The rise time of VDD power-on voltage is about 1 ms. With a time constant of only 0.1~1.0 μs in the ESD-transient detection circuit, the $V_x$ voltage can follow up the rise of VDD power-on voltage. So, the inverter output voltage $V_B$ can be kept below 0.6V during the VDD power-on transition. With $V_B$ at a low voltage (i.e., below the cut-in voltage of BJT), the N-type field-oxide device is kept off. Thus, this area-efficient VDD-to-VSS ESD protection circuit is guaranteed to be off during normal operation of the CMOS IC.

Figure 12B:
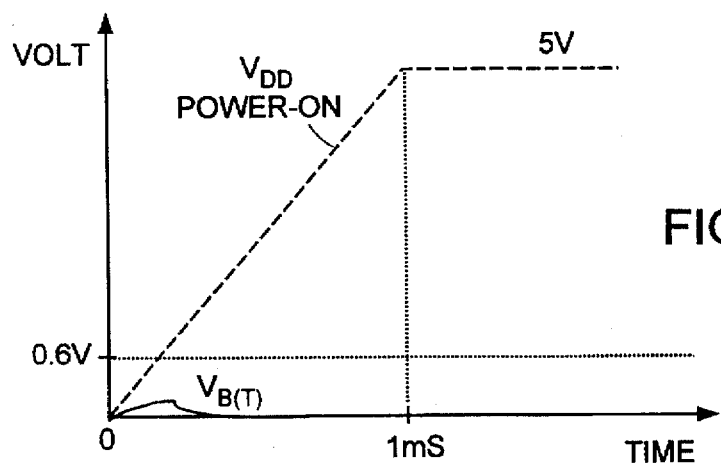
FIG. 12(b) shows a plot Of $V_{DD}$ and $V_B(t)$.
Figure 13A:
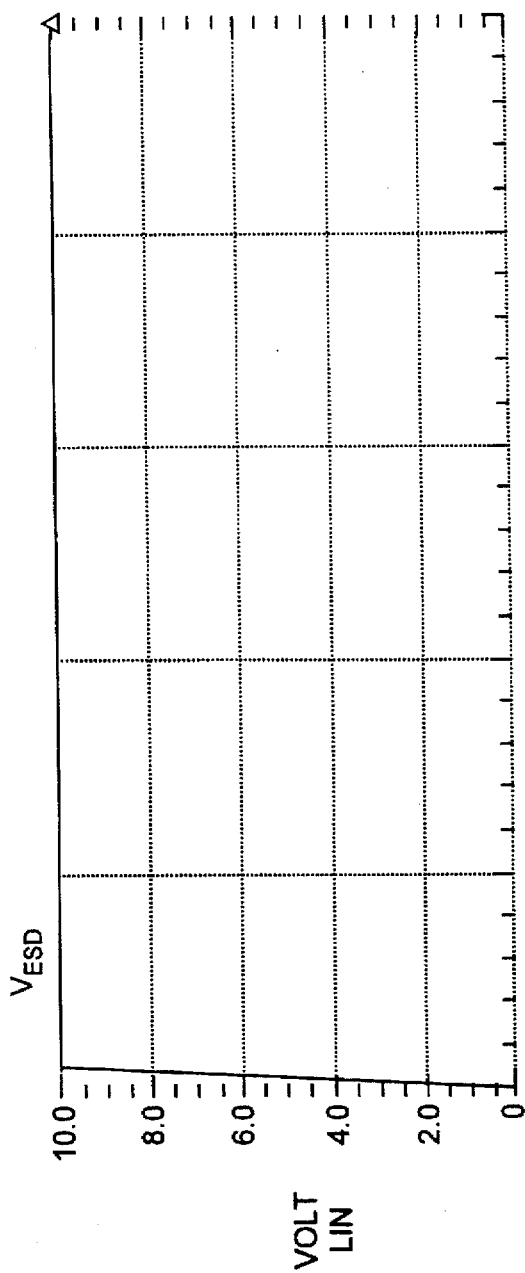
FIGS. 13(a) and (b) shows HSPICE simulation results for $V_{ESD}$ and $V_B(t)$, respectively.
Figure 13B:
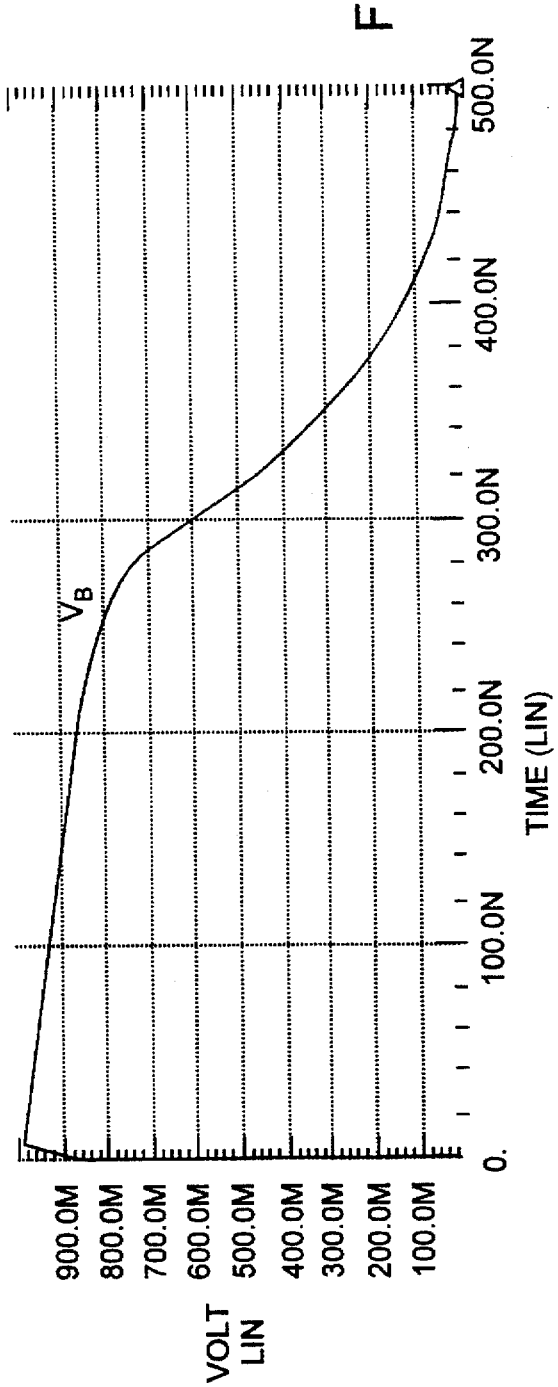
FIG. 13(c) and (d) shows HSPICE simulation results for $V_{DD}$ and $V_B(t)$, respectively.
Figure 13C:
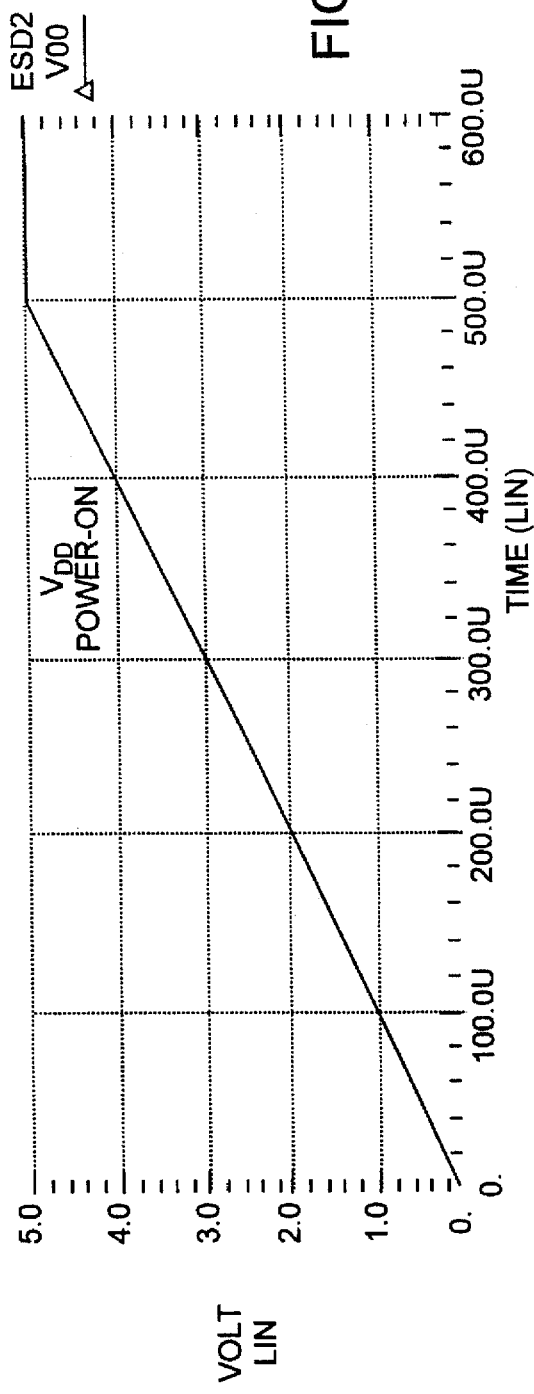
Figure 13D:
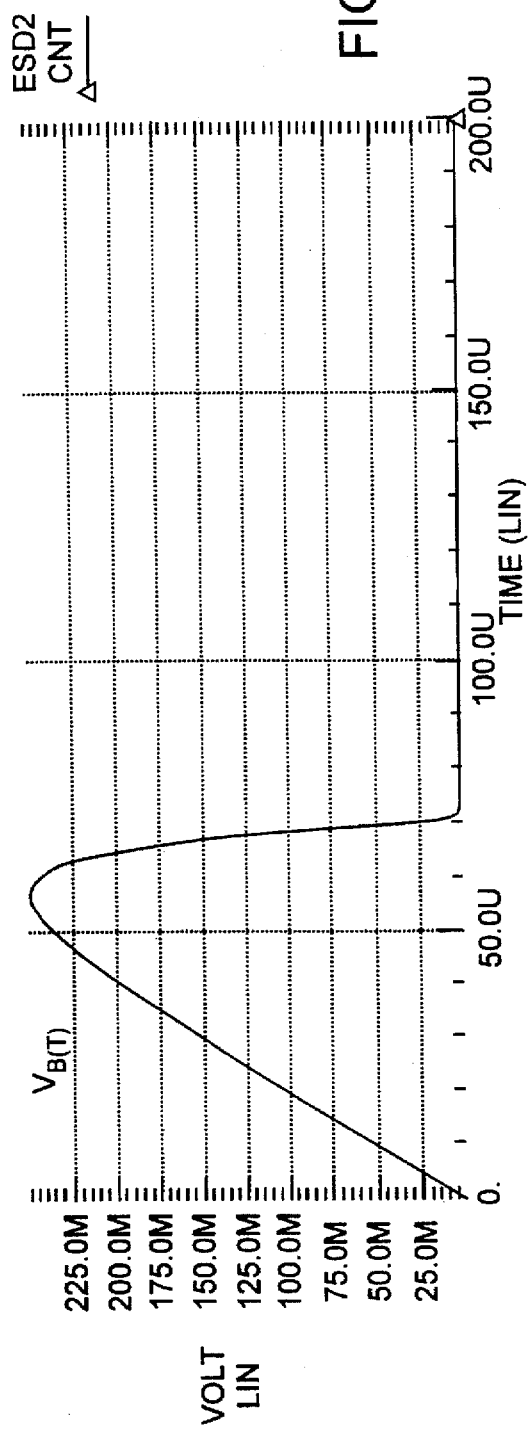

A schematic voltage waveform on VDD node and $V_B$ during VDD power-on transition is shown in FIG. 12(b). As indicated above, this can be achieved by appropriately choosing the dimensions for the R, C, Mp, and Mn devices.

HSPICE simulation

To meet both requirements of the above two conditions, the device dimensions suitable for this area-efficient VDD-to-VSS ESD protection circuit has been adjusted by HSPICE simulation in a 0.6-μm CMOS process. The typical device dimension for the resistor is 50KΩ. This resistor can be realized by a well resistor. The device dimension (width/length) for thin-oxide NMOS to realize a capacitor C of 1.8 pF is 20/20(μm). In the inverter to generate voltage $V_B$, the device dimension of Mp is 100/1.2μ), and that of Mn is 20/1.2(μm).

With such device dimensions, the HSPICE simulation results are shown in FIGS. 13(a–d). In FIGS. 13 (a–b), the ESD voltage on the VDD power line is simulated as a 10-V ramp voltage with a rise time of only 5 ns. This 10-V ramp voltage on the VDD power line leads to a $V_B$ voltage above 0.6V for as long as 300 ns. So, the N-type field-oxide device will be fully turned on to bypass ESD current. In FIGS. 13(c–d), we simulate the 5-V VDD power-on transition. As seen in the figures, the maximum voltage of $V_B$ during the VDD power-on transition with a rise time of even only 0.5ms is only 0.25V. So, the N-type field-oxide device is kept off in the CMOS IC during normal operating conditions. Thus, as verified by HSPICE simulations, the design of an area-efficient VDD-to-VSS ESD protection circuit can be practically realized using general CMOS technologies.

Obtaining Improved Bipolar Action

As described above, the ESD current is discharged through the N-type field-oxide device. The ESD current is mainly conducted through the parasitic n-p-n bipolar transistor in the N-type field-oxide device. If the efficiency of the bipolar action of the N-type field-oxide device is improved, the current-conduction capability to bypass ESD current in the N-type field-oxide device can also be improved. To improve the efficiency of bipolar action in the N-type field-oxide device, a new device structure for implementing the N-type field-oxide device is shown in FIG. 14, where it is demonstrated using a CMOS process with p-type substrate.

Figure 14:
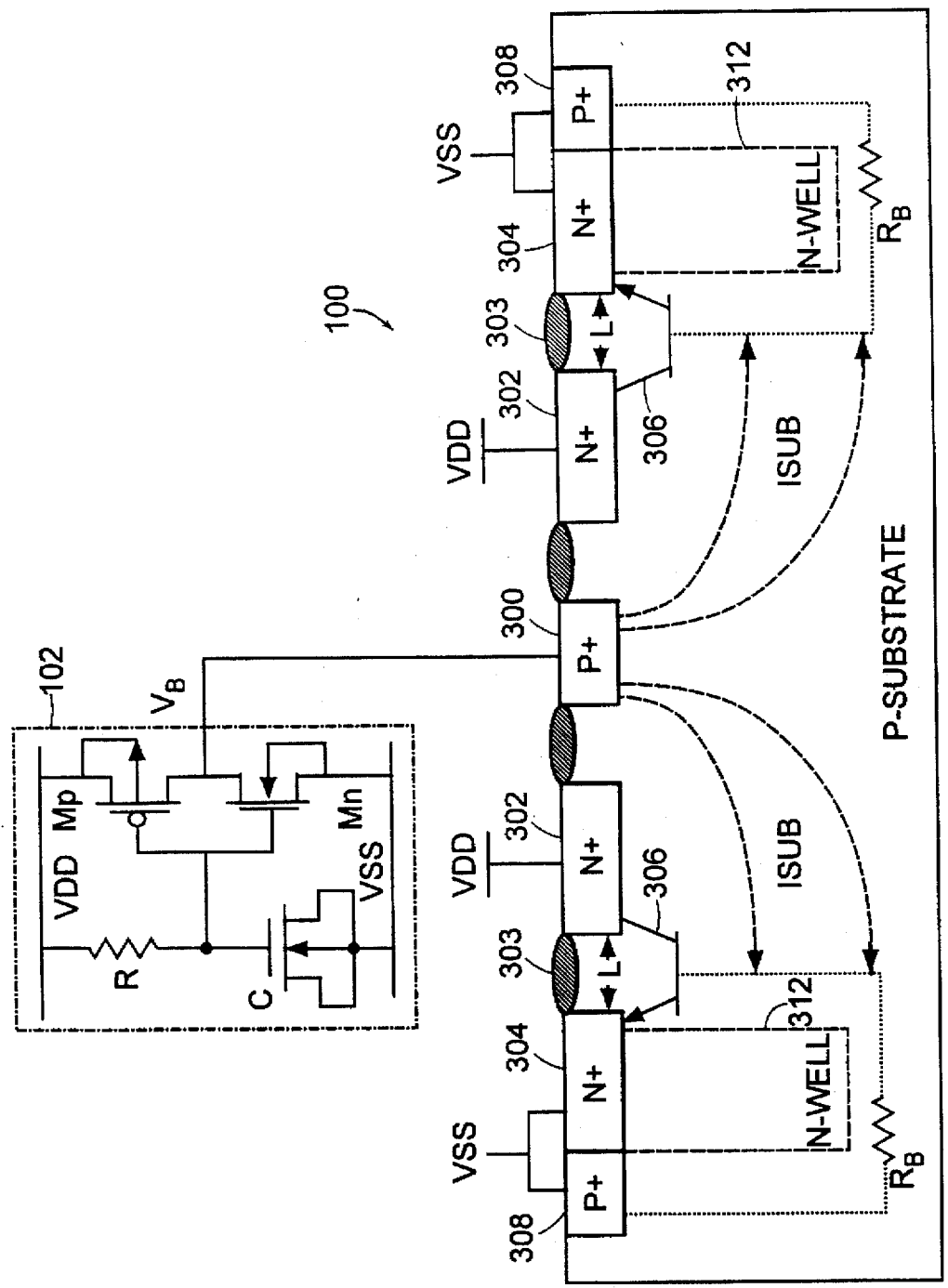
FIG. 14 shows an implementation realization using a P-substrate/N-well CMOS process.

In FIG. 14, there is a P+ diffusion 300 at the center of the device structure. This P+ diffusion 300 is connected to the output node ($V_B$) of the inverter. Surrounding the P+ diffusion 300, there is an N+ diffusion 302 which is connected to VDD. Outside the VDD-connected N+ diffusion 302 and surrounding it, there is another N+ diffusion 304 which is connected to VSS. A field oxide 303 bridges between the two N+ diffusions and there is optionally a metalization (not shown) over the field oxide 303. These two N+ diffusions 302 and 304 and the field oxide 303 form the N-type field-oxide device. The parasitic lateral n-p-n bipolar transistor 306 is also represented schematically in FIG. 14. A P+ diffusion 308 connected to VSS surrounds the entire device and through which substrate bias is provided to the p-type substrate. This VSS-connected P+ diffusion also works as the base connection for the parasitic lateral n-p-n bipolar transistor. An N-well structure 312 is inserted in and extends below the VSS-connected N+ diffusion 304, as shown in FIG. 14, to enhance the bipolar action in this N-type field-oxide device. As $V_B$ increases to a high voltage due to ESD stress across the VDD and VSS power lines, this causes current conduction Isub from the center P+ diffusion 300 through the p-substrate to the VSS-connected P+ diffusion 308. Isub can trigger on the lateral n-p-n bipolar transistor in the N-type field-oxide device. If the base resistor $R_B$ in the lateral n-p-n bipolar transistor is larger, this lateral bipolar action will be more easily turned on. Because the junction depth of N-well is about 2 μm in state-of-art submicron CMOS processes but the junction depth of N+ diffusion is only about 0.2 μm, the N-well structure increases the effective $R_B$ so as to aid in turning-on the bipolar action. Moreover, the N-well structure more efficiently collects the Isub current from the center P+ diffusion to increase its base-emitter voltage. This also enhances the bipolar action of the N-type field-oxide device. By using such a device structure, the robustness of the ESD-protection provided by the N-type field-oxide device is further improved. So, the N-type field-oxide device provides greater ESD robustness without requiring large device dimensions. Thus, the invention provides higher ESD-protection capability from the VDD to VSS power lines within a smaller layout area to save silicon cost of the IC product.

Layout Example

Figure 15:
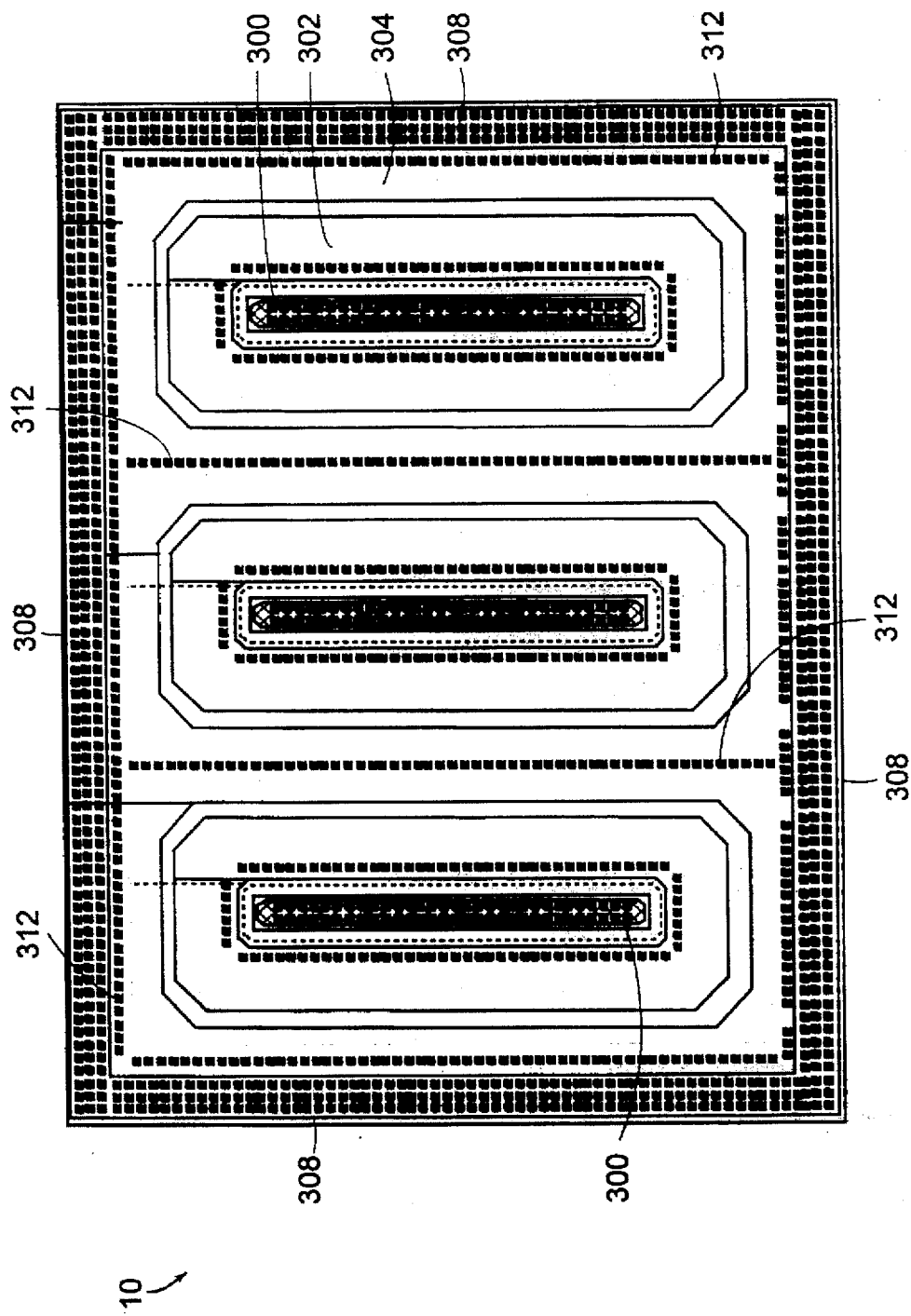
FIG. 15 is an example of a layout of an n-type field-oxide device.

A practical layout example of the N-type field-oxide device with the device structure illustrated in FIG. 14 is shown in FIG. 15. The N-type field-oxide device is implemented using three fingers with dimensions (width/length) of 438/1.2 (μm). The layout area for this N-type field-oxide device is only about 103×79 μm$^2$ for a 0.6-μm CMOS technology.

Figure 16:
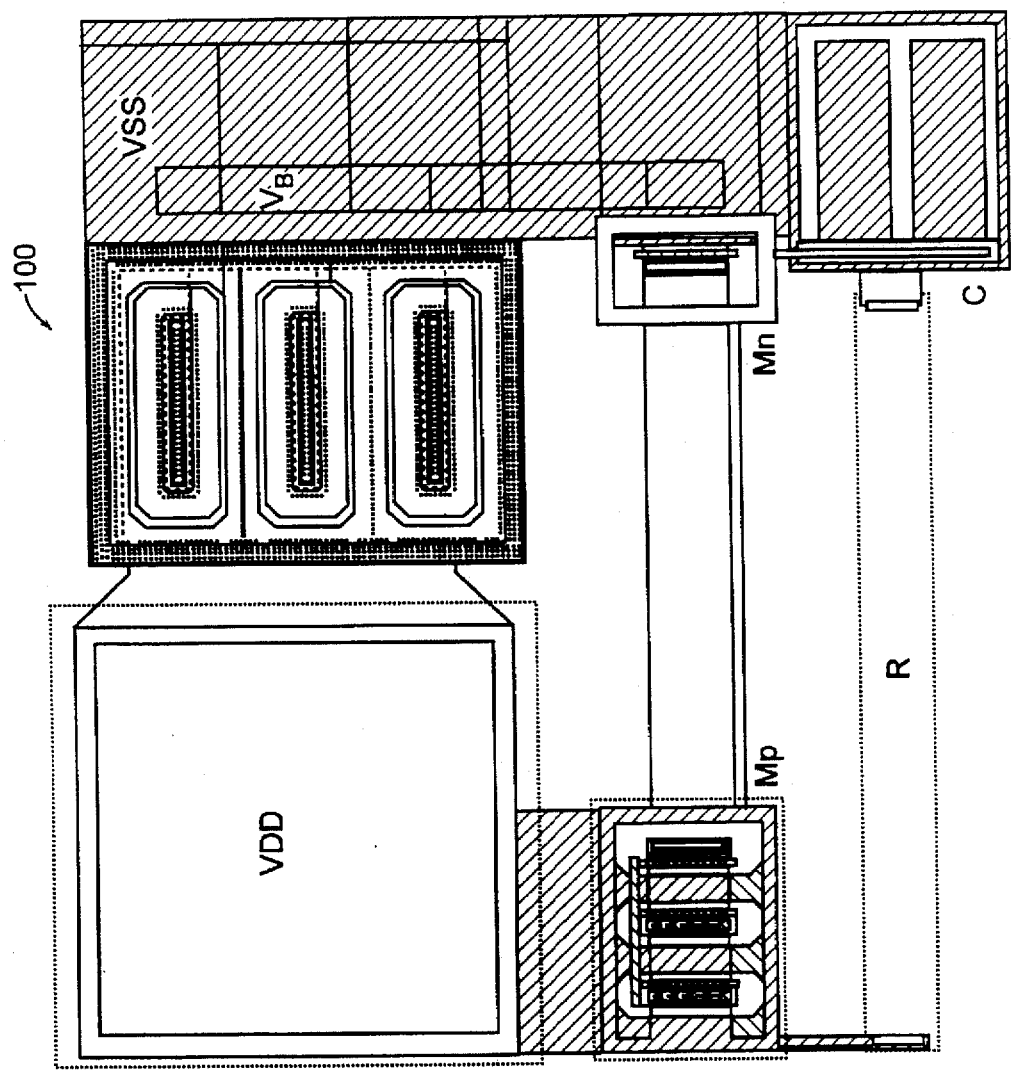
FIG. 16 is an example of an overall layout.

With the three-finger N-type field-oxide device of FIG. 15 and the device dimensions noted above, an entire layout of the area-efficient VDD-to VSS ESD-protection circuit is illustrated in FIG. 16, where the 50-KΩ resistor is implemented by an N-well resistor. The total layout area of the circuit of FIG. 16 including a metal pad of 105×105 μm$^2$ is only about 226×252 μm$^2$. If the sheet resistance of the polysilicon is high enough (e.g. 30~50Ω/□), the resistor R can also be realized by a poly line.

Modified Design

Figure 17:
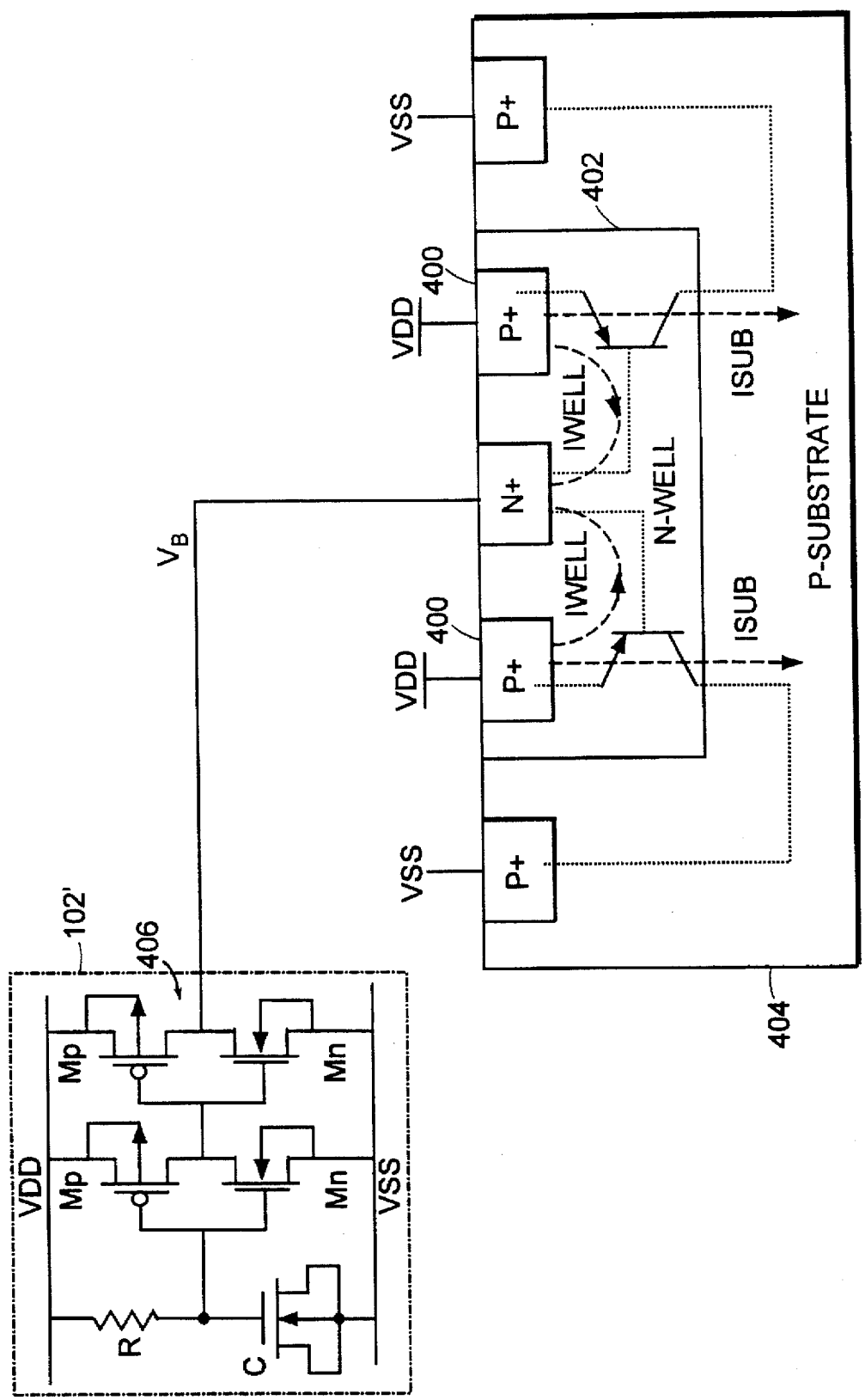
FIG. 17 is an example of an implementation using an n-well/p-substrate process and a vertical bipolar transistor.

The ESD-discharging N-type field-oxide device in this invention can be also implemented by other parasitic bipolar devices. FIG. 17 shows an ESD-discharging device which is implemented using a vertical p-n-p transistor of a p-substrate/n-well CMOS process. The vertical p-n-p bipolar transistor is formed by a P+ diffusion 400, an N-well 402, and a P-substrate 404. To turn on this vertical p-n-p bipolar transistor under ESD-stress conditions, there is an extra inverter stage 406 inserted into the ESD-transient detection circuit 102' to perform ESD-protection.

Figure 18:
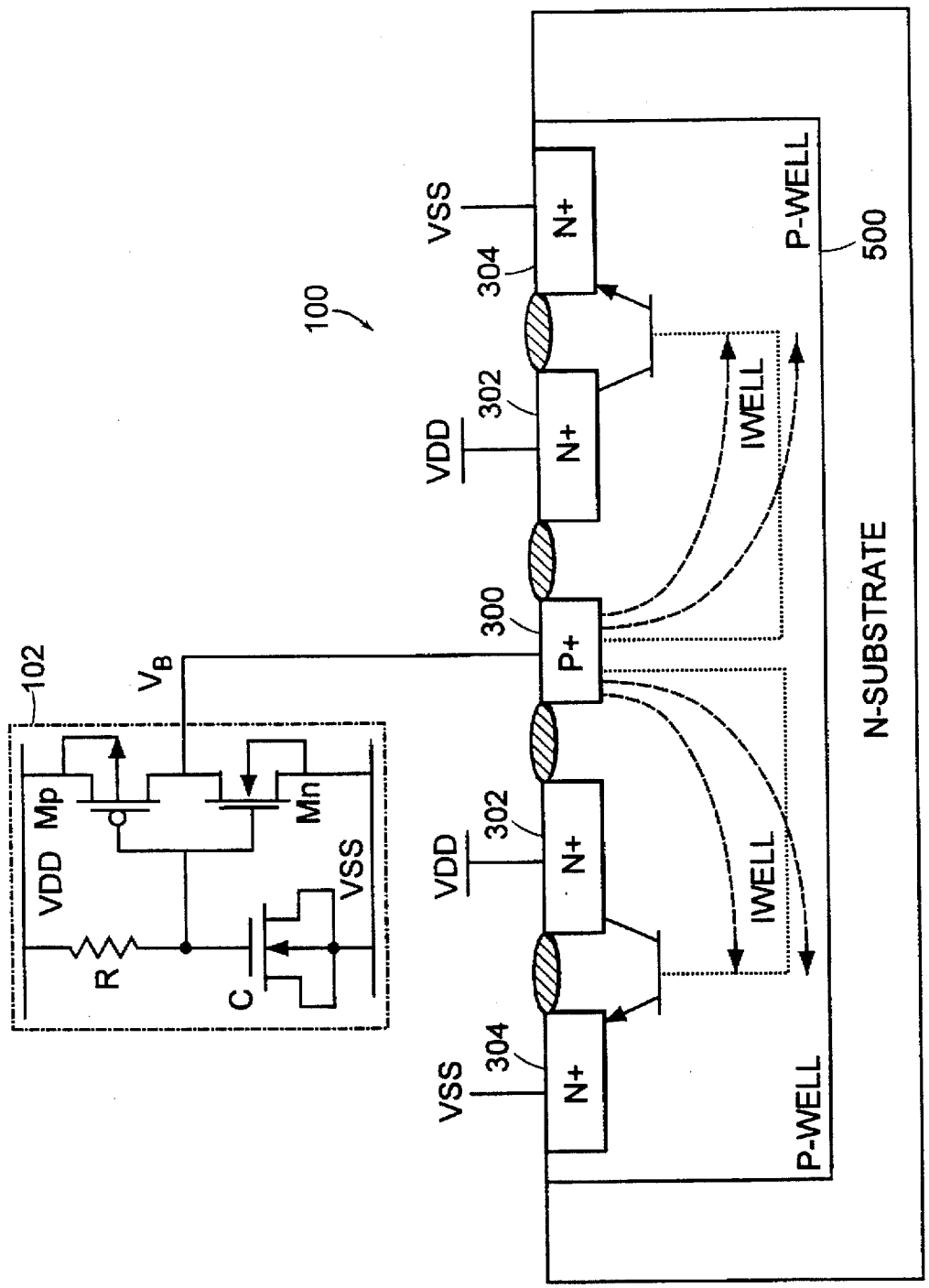
FIG. 18 is an example of an implementation using a p-well/n-substrate CMOS process.
Figure 19:
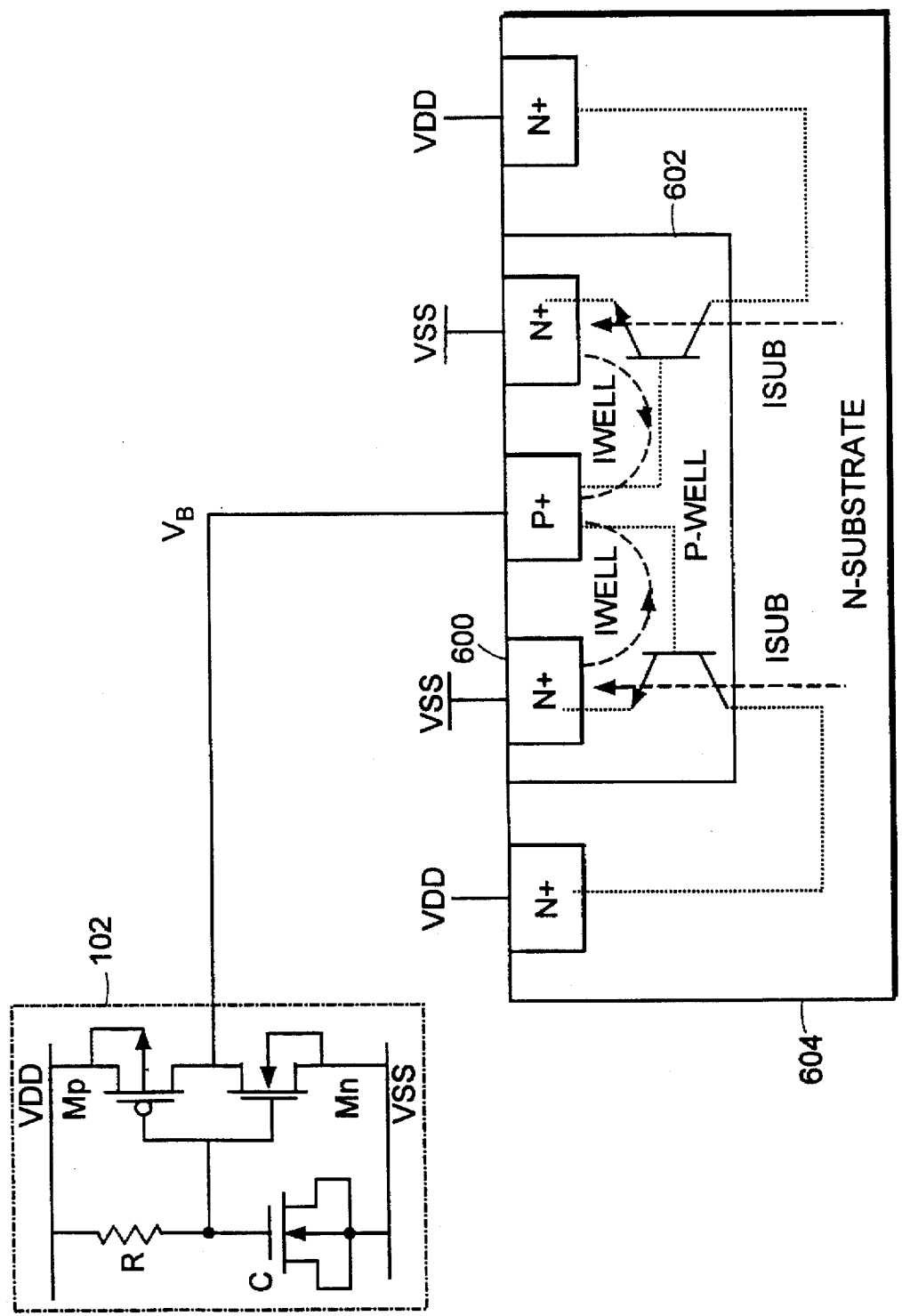
FIG. 19 is an example of a modified implementation using an p-well/n-substrate process and a vertical bipolar transistor.

This area-efficient VDD-to-VSS ESD protection circuit can also be implemented through a CMOS process with n-substrate/p-well structure. Typical examples are shown in FIG. 18 and FIG. 19. In FIG. 18, the N-type field-oxide device is implemented in a P-well 500, and this P-well is only biased by the $V_B$ voltage. If $V_B$ is higher than 0.6V, the lateral n-p-n bipolar action in the N-type field-oxide device will be turned on to bypass ESD current. In the n-substrate/p-well CMOS process, a parasitic vertical n-p-n bipolar transistor can also be used as the ESD-discharging device.

FIG. 19 shows such design with the vertical n-p-n bipolar transistor to bypass ESD current. In this case, the vertical n-p-p bipolar transistor is formed by a N+ diffusion 600, a P-well 602, and an N-substrate 604.

It should be understood that the invention can be implemented using any CMOS and/or BiCMOS technologies.

Other embodiments are within the following claims.

What is claimed is:

1. An electrostatic discharge (ESD) protection circuit which forms part of an integrated circuit having a VDD line and a VSS line, said protection circuit comprising:

an ESD transient detection circuit connected between the VDD and VSS lines; and an electrostatic discharge circuit driven by said transient detection circuit and connected between said VDD and VSS lines, wherein said discharge circuit comprises a lateral bipolar transistor having an emitter and a collector, one of which is electrically connected to the VDD line and the other of which is electrically connected to the VSS line, wherein said lateral bipolar transistor is implemented by a field oxide device, and wherein said bipolar transistor has a base that is electrically coupled to the transient detection circuit.

2. The electrostatic discharge protection circuit of claim 1 wherein the emitter region and the collector regions are connected directly to their respective VDD and VSS lines.

3. The electrostatic protection circuit of claim 1 wherein the field oxide device has a drain region, a source region, and a channel region therebetween, said channel region being covered by a field oxide layer.

4. The electrostatic protection circuit of claim 3 wherein the channel region is sufficiently narrow to enable the field oxide device to operate as said bipolar transistor.

5. The electrostatic protection circuit of claim 4 wherein the field oxide device further comprises a well region extending below the source region, said well region having the same conduction type as the source region.

6. The electrostatic protection circuit of claim wherein the field-oxide device is an n-type field oxide device.

7. The electrostatic protection circuit of claim 6 wherein the electrostatic discharge circuit is formed in a p-type substrate and wherein the field oxide device comprises:

a p-type region extending into the p-type substrate;

a first n-type region extending into the p-type substrate, said first n-type region surrounding and spatially separated from the p-type region;

a second n-type region extending into the p-type substrate, said second n-type region surrounding and spatially separated from the first n-type region; and an oxide layer bridging between the first and second n-type regions.

8. The electrostatic protection circuit of claim 7 wherein the field oxide device further comprises a third n-type region passing through and extending below the second n-type region to form an n-type well structure.

9. The electrostatic protection circuit of claim 8 wherein the third n-type region surrounds the first n-type region.

10. The electrostatic protection circuit of claim 9 wherein the field oxide device further comprises a second p-type region extending into the p-type substrate, said second p-type region surrounding said second n-type region.

11. The electrostatic protection circuit of claim 10 wherein the first and second n-type regions are doped to n+ doping levels.

12. The electrostatic protection circuit of claim 11 wherein the first mentioned p-type region is doped to a p+ doping level.

13. The electrostatic protection circuit of claim 6 wherein the electrostatic discharge circuit is formed in a n-type substrate and wherein the field oxide device comprises:

a p-well region formed in the n-type substrate;

a p-type region extending into the p-well region;

a first n-type region extending into the p-well region, said first n-type region surrounding and spatially separated from the p-type region;

a second n-type region extending into the p-well region, said second n-type region surrounding and spatially separated from the first n-type region; and an oxide layer bridging between the first and second n-type regions.

14. The electrostatic protection circuit of claim 13 wherein the first and second n-type regions are doped to n+ doping levels.

15. The electrostatic protection circuit of claim 14 wherein the first mentioned p-type region is doped to a p+ doping level.

16. An electrostatic discharge protection circuit which forms part of an integrated circuit having a VDD line and a VSS line, said protection circuit comprising:

an ESD transient detection circuit connected between the VDD and VSS lines; and an electrostatic discharge circuit electrically coupled to said transient detection circuit and connected between said VDD and VSS lines, wherein said discharge circuit comprises a bipolar transistor having an emitter and a collector, one of which is electrically connected to the VDD line and the other of which is electrically connected to the VSS line, wherein said bipolar transistor is implemented by a vertical bipolar transistor and a field oxide device, said bipolar transistor said vertical bipolar transistor is a p-n-p device; and wherein said electrostatic discharge circuit is formed in a p-type substrate and said vertical bipolar transistor comprises:

an n-well region extending into said p-type substrate;

an n-type region extending into said n-well region;

a first p-type region extending into said n-well region, said first p-type region surrounding and spatially separated from the n-type region and forming an emitter of said vertical bipolar transistor; and a second p-type region extending into said p-type substrate, said second p-type region surrounding and spatially separated from the n-well region.

17. The electrostatic protection circuit of claim 16 wherein the first and second p-type regions are doped to p+ doping levels.

18. The electrostatic protection circuit of claim 17 wherein the n-type region is doped to an n+ doping level.

19. An electrostatic discharge protection circuit which forms part of an integrated circuit having a VDD line and a VSS line, said protection circuit comprising:

an ESD transient detection circuit connected between the VDD and VSS lines; and an electrostatic discharge circuit electrically coupled to said transient detection circuit and connected between said VDD and VSS lines, wherein said discharge circuit comprises a bipolar transistor having an emitter and a collector, one of which is electrically connected to the VDD line and the other of which is electrically connected to the VSS line, wherein said bipolar transistor is implemented by a vertical bipolar transistor, wherein said vertical bipolar transistor is a n-p-n device; and wherein said electrostatic discharge circuit is formed in a n-type substrate and said vertical bipolar transistor comprises:

a p-well region extending into said n-type substrate;

a p-type region extending into said p-well region;

a first n-type region extending into said p-well region, said first n-type region surrounding and spatially separated from the p-type region and forming an emitter of said vertical bipolar transistor; and a second n-type region extending into said n-type substrate, said second n-type region surrounding and spatially separated from the p-well region.

20. The electrostatic protection circuit of claim 19 wherein the first and second n-type regions are doped to n+ doping levels.

21. The electrostatic protection circuit of claim 20 wherein the p-type region is doped to a p+ doping level.

22. An electrostatic discharge protection circuit which forms part of an integrated circuit having a VDD line and a VSS line, said protection circuit comprising:

an ESD transient detection circuit connected between the VDD and VSS lines wherein said ESD transient detection circuit comprises a resistor in series with a capacitor and an inverter coupled to the resistor and capacitor; and an electrostatic discharge circuit electrically coupled to said transient detection circuit and connected between said VDD and VSS lines, wherein said discharge circuit comprises a bipolar transistor having an emitter and a collector, one of which is electrically connected to the VDD line and the other of which is electrically connected to the VSS line, wherein said bipolar transistor is implemented by a structure selected from a group consisting of a vertical bipolar transistor and a field oxide device, and wherein said bipolar transistor has a base that is electrically coupled to the transient detection circuit.

23. The electrostatic protection circuit of claim 22 wherein the capacitor is implemented by a NMOS device.

24. The electrostatic protection circuit of claim 23 wherein the inverter comprises a PMOS device and an NMOS device connected in series.

25. The electrostatic protection circuit of claim 24 wherein the output of the inverter drives the base of the bipolar transistor.

* * * * *